United States Patent
Takahashi et al.

(10) Patent No.: US 9,065,403 B2
(45) Date of Patent: Jun. 23, 2015

(54) RUNNING-LINKED SOUND PRODUCING DEVICE

(75) Inventors: Hiroyuki Takahashi, Shizuoka (JP); Mikio Saitou, Shizuoka (JP); Osamu Maeda, Shizuoka (JP)

(73) Assignee: Yamaha Hatsudoki Kabushiki Kaisha, Shizuoka (JP)

( * ) Notice: Subject to any disclaimer, the term of this patent is extended or adjusted under 35 U.S.C. 154(b) by 350 days.

(21) Appl. No.: 13/823,827

(22) PCT Filed: Oct. 14, 2011

(86) PCT No.: PCT/JP2011/073672
§ 371 (c)(1),
(2), (4) Date: Mar. 15, 2013

(87) PCT Pub. No.: WO2013/021513
PCT Pub. Date: Feb. 14, 2013

(65) Prior Publication Data
US 2013/0182864 A1  Jul. 18, 2013

(30) Foreign Application Priority Data

Aug. 8, 2011 (JP) ................. 2011-173456

(51) Int. Cl.
| | |
|---|---|
| *H03G 5/00* | (2006.01) |
| *B60Q 5/00* | (2006.01) |
| *B62J 3/00* | (2006.01) |
| *G10K 15/02* | (2006.01) |

(52) U.S. Cl.
CPC ................. *H03G 5/00* (2013.01); *B60Q 5/008* (2013.01); *B62J 3/00* (2013.01); *B62K 2204/00* (2013.01); *G10K 15/02* (2013.01)

(58) Field of Classification Search
None
See application file for complete search history.

(56) References Cited

U.S. PATENT DOCUMENTS

| | | | | |
|---|---|---|---|---|
| 5,635,903 | A * | 6/1997 | Koike et al. | .................... 340/441 |
| 2005/0113168 | A1 | 5/2005 | Maeda | |
| 2008/0060861 | A1 | 3/2008 | Baur et al. | |
| 2010/0166210 | A1* | 7/2010 | Isozaki | ........................... 381/86 |

(Continued)

FOREIGN PATENT DOCUMENTS

| | | |
|---|---|---|
| CN | 201721384 U | 1/2011 |
| CN | 102039050 A | 5/2011 |
| JP | 2000-001142 A | 1/2000 |

(Continued)

OTHER PUBLICATIONS

Official Communication issued in corresponding Chinese Patent Application No. 201180061313.2, mailed on Jan. 6, 2015.

(Continued)

*Primary Examiner* — Brenda Bernardi
(74) *Attorney, Agent, or Firm* — Keating & Bennett, LLP

(57) ABSTRACT

A running-linked sound generation unit includes an order sound data generation unit, a random sound data generation unit, and a synthesis unit. The order sound data generation unit generates order sound data by changing the tone of basic order sound data according to a motor rotation speed of a vehicle. The random sound data generation unit generates random sound data by changing the volume of basic random sound data according to a motor rotation speed and an accelerator command value of a vehicle, without changing the tone of the basic random sound data. The synthesis unit generates synthetic sound data by combining synthesized order sound data and random sound data.

3 Claims, 19 Drawing Sheets

(56) References Cited

U.S. PATENT DOCUMENTS

2011/0085674 A1    4/2011    Fujikawa
2012/0323442 A1    12/2012    Tanaka et al.

FOREIGN PATENT DOCUMENTS

| | | |
|---|---|---|
| JP | 2005-134885 A | 5/2005 |
| JP | 2006-069487 A | 3/2006 |
| JP | 2006-298111 A | 11/2006 |
| JP | 2009-040317 A | 2/2009 |
| JP | 2010-026033 A | 2/2010 |
| JP | 4669585 B1 | 4/2011 |

OTHER PUBLICATIONS

Official Communication issued in International Patent Application No. PCT/JP2011/073672, mailed on Jan. 17, 2012.
Takahashi et al., "Running-Linked Sound Producing Device", U.S. Appl. No. 13/823,840, filed Mar. 15, 2013.

* cited by examiner

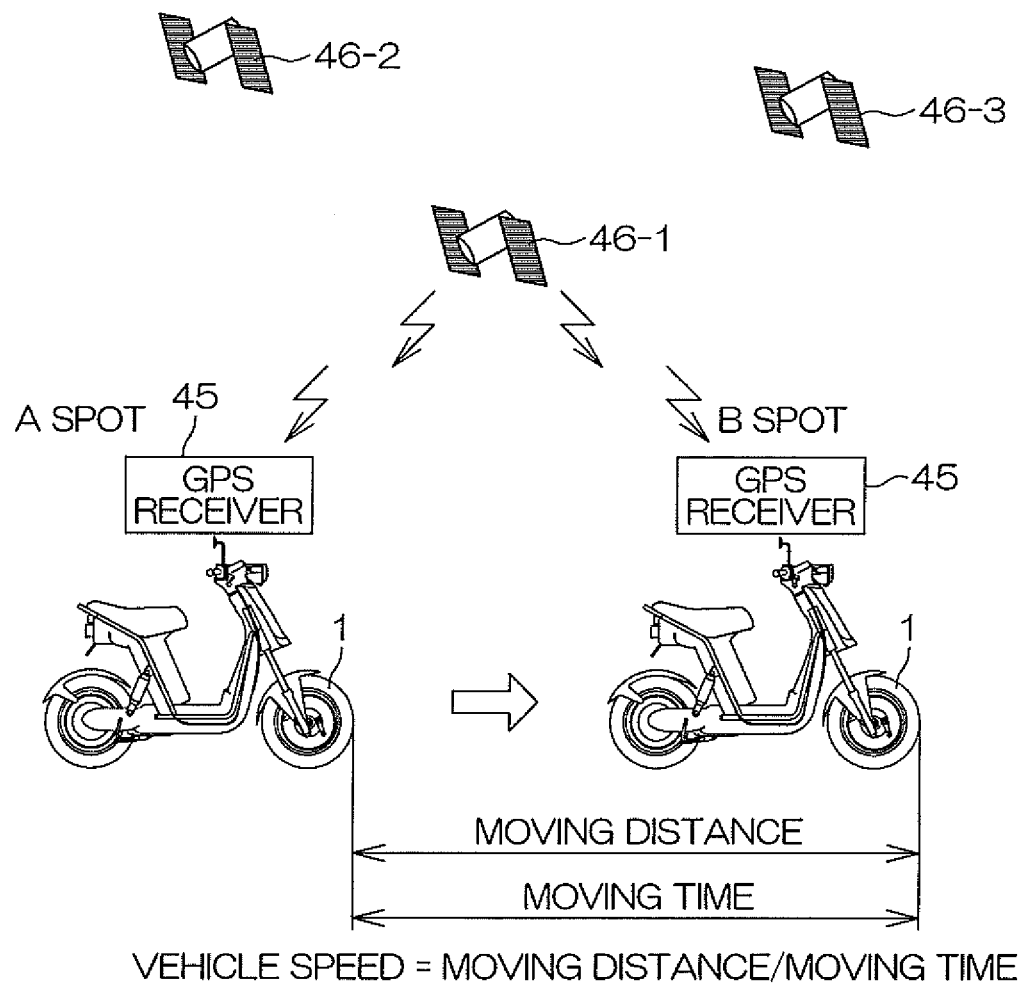

RUNNING-LINKED SOUND PRODUCING DEVICE

BACKGROUND OF THE INVENTION

1. Field of the Invention

The present invention relates to a running-linked sound producing device for producing a running-linked sound according to the running state of a vehicle. The vehicle may be an actual vehicle or may be a virtual vehicle.

2. Description of the Related Art

Japanese Unexamined Patent Application Publication No. 2000-1142 discloses an engine sound synthesizer that reads out from a storage unit engine sound data corresponding to an operation state specified based on an engine speed and an accelerator operation amount and reproduces the engine sound data. In the engine sound synthesizer, a reproduction rate of the engine sound data is determined according to the engine speed.

Japanese Unexamined Patent Application Publication No. 2006-69487 discloses an engine sound synthesizer that generates synthetic sound data according to an engine speed and a throttle opening degree, and provides fluctuations according to a combustion pressure data to the synthetic sound data.

Japanese Unexamined Patent Application Publication No. 2010-26033 discloses a sound device that produces music, a scale sound, or an alarm sound so that the tempo, volume, or pitch changes according to a moving speed of a moving body.

The engine sound synthesizers of Japanese Unexamined Patent Application Publication No. 2000-1142 and Japanese Unexamined Patent Application Publication No. 2006-69487 produce engine sounds that are heard at all times during driving of vehicles powered by engines, and can thus provide natural comfortable sounds. However, the configuration becomes complicated for reading out different engine sound data depending on the operation state and the like or for providing fluctuations to engine sound data, so that there is a large computational load on a computer component of the system.

With the sound device of Japanese Unexamined Patent Application Publication No. 2010-26033, the sound to be produced is likely to be a monotonous sound lacking depth (or thickness), and may not always be a comfortable sound to people around the moving body and a passenger on the moving body. In particular, the passenger on the moving body constantly hears that sound while moving, and it is thus desirable to provide a comfortable sound that fluctuates according to the state of the moving body and has sufficient depth (for example, with a sense of depth).

SUMMARY OF THE INVENTION

A preferred embodiment of the present invention provides a running-linked sound producing device which has a simple configuration and is capable of producing a comfortable running-linked sound.

A preferred embodiment of the present invention provides a running-linked sound producing device for producing a running-linked sound according to a running state of a vehicle, including a first component sound data generating unit programmed to generate first component sound data by changing a tone of first component basic sound data according to a motor rotation speed of the vehicle, a second component sound data generating unit programmed to generate second component sound data by changing a volume of second component basic sound data according to a motor rotation speed and an accelerator command value of the vehicle, without changing a tone of the second component basic sound data, and a synthetic sound data generating unit programmed to generate synthetic sound data by combining the first component sound data generated by the first component sound data generating unit and the second component sound data generated by the second component sound data generating unit.

According to this arrangement, first component sound data whose tone is changed according to a motor rotation speed and second component sound data whose volume is changed according to a motor rotation speed and an accelerator command value without being changed in tone are combined to generate synthetic sound data. That is, the first component sound data changes in tone according to a motor rotation speed, while the second component sound data changes in volume according to a motor rotation speed and the like, without being changed in tone. Therefore, synthetic sound data to be generated by combining these sound data can be provided as data expressing a deep (with a sense of depth), comfortable running-linked sound. Furthermore, because synthetic sound data is obtained preferably by generating first component sound data by changing the tone of first component basic sound data, generating second component sound data by changing the volume of second component basic sound data, and combining these sound data, the configuration is simple. Therefore, a comfortable running-linked sound can be generated with the simple configuration.

The "running state of a vehicle" includes a vehicle speed, an acceleration, a motor load, and the like. The vehicle may be an actual vehicle or may be a virtual vehicle. Moreover, the motor may also be an actual motor or may be a virtual motor. For example, when a running-linked sound producing device is mounted on an actual vehicle, if its motor serving as a power source is an electric motor, the rotation speed of the electric motor may be used as the "motor rotation speed." Alternatively, if the motor is, for example, an engine, the rotation speed of the virtual motor may be used as the "motor rotation speed." Likewise, the "accelerator command value" may be a value corresponding to the operation amount of an accelerator operator in an actual vehicle, or may be a value representing the virtual accelerator operation amount in a virtual vehicle.

In a preferred embodiment of the present invention, the first component basic sound data includes basic data corresponding to an order sound whose frequency fluctuates according to a motor rotation speed, and the second component basic sound data includes basic data corresponding to a random sound whose frequency does not fluctuate regardless of a motor rotation speed. This arrangement allows generating an appropriate running-linked sound corresponding to the motor rotation speed.

The order sound may be, from a sound to be produced by the vehicle or motor, a sound whose frequency (or frequency spectrum) fluctuates according to a motor rotation speed. Likewise, the random sound may be, from a sound to be produced by the vehicle or motor, a sound whose frequency (or frequency spectrum) does not substantially fluctuate regardless of a motor rotation speed.

Moreover, in a preferred embodiment of the present invention, the first component sound data generating unit preferably includes a tone changing unit programmed to change a tone of the first component basic sound data according to a motor rotation speed of the vehicle, and a first component volume changing unit programmed to change a volume of the first component basic sound data according to a motor rotation speed and an accelerator command value of the vehicle. As a result, not only the tone of first component basic sound data but also the volume thereof can be appropriately changed according to a motor rotation speed, so that a running-linked sound corresponding to the running state of the vehicle can be generated.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 16A is a view for explaining a running-linked sound producing device according to another preferred embodiment of the present invention, showing vehicle speed estimation using position data output by a GPS receiver.

DETAILED DESCRIPTION OF THE PREFERRED EMBODIMENTS

Hereinafter, preferred embodiments of the present invention will be described in detail with reference to the accompanying drawings.

Figure 1:
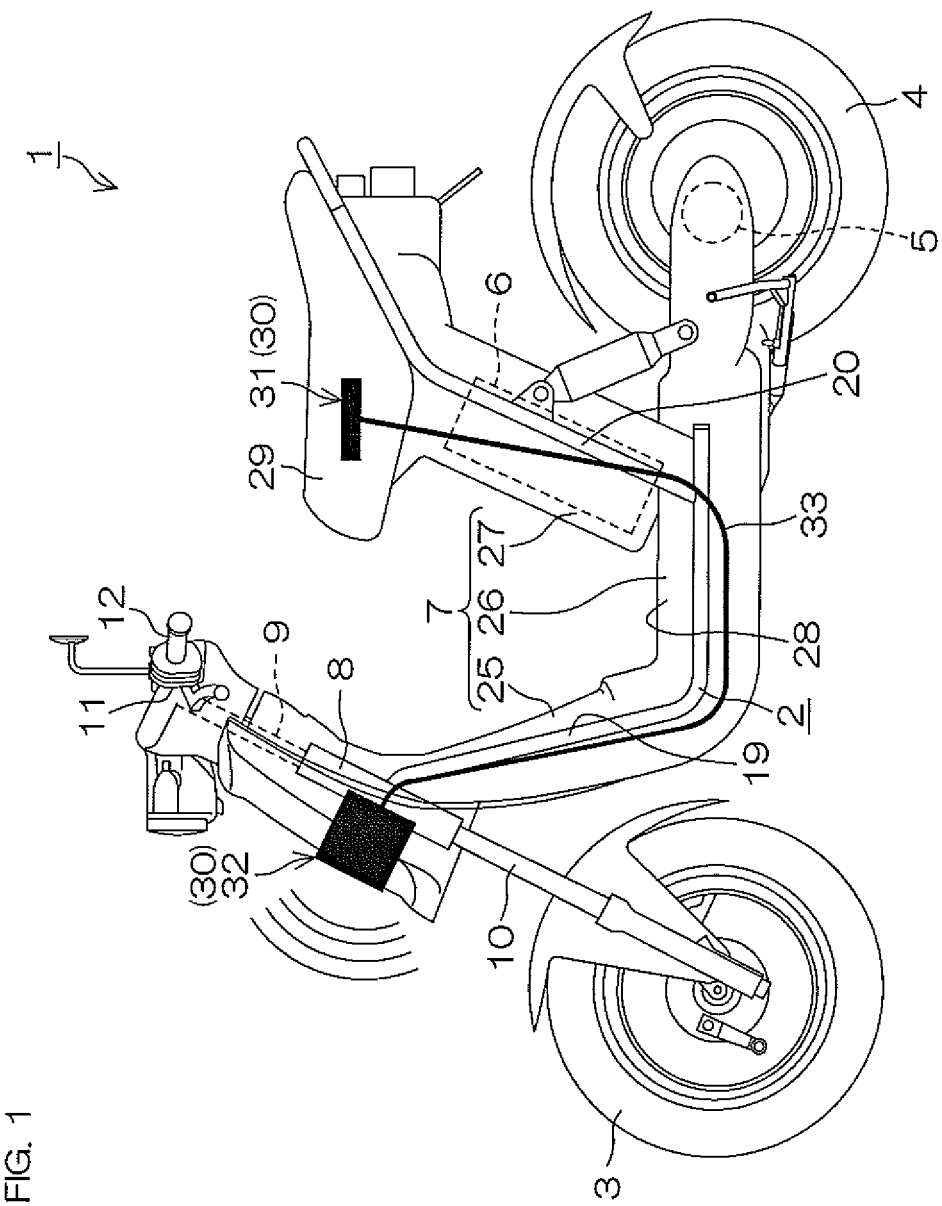
FIG. 1 is a schematic side view showing a vehicle mounted with a running-linked sound producing device according to a preferred embodiment of the present invention.

FIG. 1 is a schematic side view showing a vehicle mounted with a running-linked sound producing device according to a preferred embodiment of the present invention. The vehicle is, for example, an electric two-wheeled vehicle 1. More specifically, the electric two-wheeled vehicle 1 preferably is a scooter-type electric two-wheeled vehicle, and includes a vehicle body frame 2, a front wheel 3, a rear wheel 4, an electric motor 5, a battery 6, and a vehicle body cover 7, for example. The electric two-wheeled vehicle 1 is arranged to drive the electric motor 5 by electricity supplied from the battery 6 and drive the rear wheel 4 serving as a driven wheel by an output of the electric motor 5.

Into a head pipe 8 disposed on an upper front portion of the vehicle body frame 2, a steering shaft 9 is freely rotatably inserted. At a lower end portion of the steering shaft 9, a pair of left and right front forks 10 are attached. The front wheel 3 is attached to the front forks 10. At an upper end portion of the steering shaft 9, a handle 11 is attached. A rider can turn the steering shaft 9, the front forks 10, and the front wheel 3 about the axis of the steering shaft 9 by operating the handle 11.

At both left and right end portions of the handle 11, grips 12 are provided, respectively (only the left grip is shown). The right grip is an accelerator grip (accelerator operator). The rider can adjust the output of the electric motor 5 by turning the accelerator grip.

The vehicle body frame 2 extends rearward from the head pipe 8. The vehicle body frame 2 includes a down tube 19 and a pair of left and right frame main bodies 20 disposed behind the down tube 19. The down tube 19 extends obliquely rearward and downward from a lower portion of the head pipe 8. The frame main bodies 20 each have a substantially S-shape in a side view, extend rearward from a lower end portion of the down tube 19, run obliquely upward to extend further rearward, and then extend rearward substantially horizontally.

The vehicle body cover 7 is attached to the vehicle body frame 2. The vehicle body cover 7 includes a front cover 25 that covers the head pipe 8, a lower cover 26 that extends rearward from a lower portion of the front cover 25, and a rear cover 27 disposed behind the front cover 25. The front cover 25 surrounds a portion of the steering shaft 9 and the head pipe 8, and surrounds the down tube 19. The lower cover 26 extends rearward from a lower portion of the front cover 25, and covers a portion of the frame main bodies 20 downward from both the left and right sides. At an upper surface of the lower cover 26, a footrest portion 28 is disposed. The footrest portion 28 is provided for a rider to place his/her feet, and is substantially flat. The rear cover 27 as a whole has a shape extending obliquely rearward and upward from a rear portion of the lower cover 26. The rear cover 27 covers a portion of the frame main bodies 20 from the front and both the left and right sides.

A seat 29 for a rider to sit is attached to an upper portion of the frame main bodies 20. Below the seat 29, an accommodating space is provided between the left and right pair of frame main bodies 20. In the accommodating space, a battery 6 serving as a power supply of the electric motor 5 is disposed. The battery 6 is a rechargeable secondary battery.

The running-linked sound producing device 30 includes a device main body 31 and a speaker 32. In the example of FIG. 1, the device main body 31 is disposed below the seat 29 and attached to the frame main bodies 20. The speaker 32 is attached to, for example, the head pipe 8. The device main body 31 and the speaker 32 are connected by a wiring 33. The wiring 33 is routed inside the vehicle body cover 7, and transfers an audio signal produced by the device main body 31 to the speaker 32.

Figure 2:
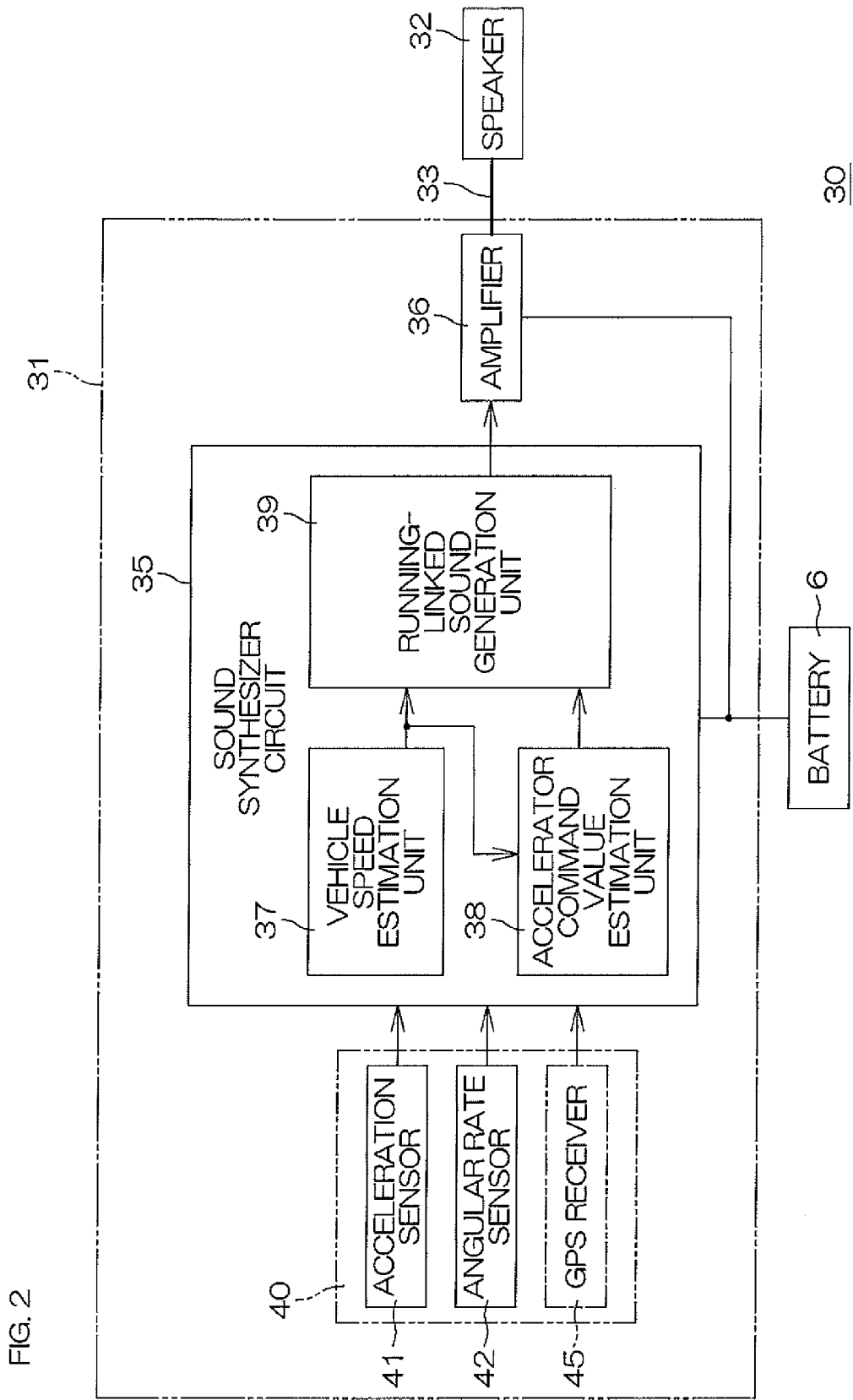
FIG. 2 is a block diagram for explaining an electrical configuration of the running-linked sound producing device.

FIG. 2 is a block diagram for explaining an electrical configuration of the running-linked sound producing device 30. The device main body 31 is connected to the battery 6 of the electric two-wheeled vehicle 1 via a power supply wiring, and is configured so as to operate by being supplied with electricity from the battery 6. Of course, a configuration may be used in which the device main body 31 includes a built-in battery, and the device main body 31 operates by the built-in battery.

The device main body 31 includes a sound synthesizer circuit 35, an amplifier 36, and sensors 40. The sensors 40 are provided in a case of the device main body 31.

The sensors 40, in the present preferred embodiment, include an acceleration sensor 41 and an angular rate sensor 42 (gyro sensor). The acceleration sensor 41 may be a 3-axis acceleration sensor that is arranged to detect and output acceleration along the directions of three orthogonal axes (x-axis, y-axis, z-axis). In the present preferred embodiment, the x-axis of the acceleration sensor 41 matches the fore-and-aft direction of the electric two-wheeled vehicle 1, the y-axis thereof matches the left-right direction of the electric two-wheeled vehicle 1, and the z-axis thereof matches the up-down direction of the electric two-wheeled vehicle 1. That is, the device main body 31 is attached to the vehicle body frame 2 so as to have such a positional relationship. The angular rate sensor 42 is arranged to detect angular rates (roll angular rate, pitch angular rate, and yaw angular rate) about three axes (x-axis, y-axis, and z-axis), respectively. In the present preferred embodiment, the x-axis, y-axis, and z-axis of the angular rate sensor 42 are coincident with the x-axis, y-axis, and z-axis of the acceleration sensor 41, respectively. That is, the acceleration sensor 41 and the angular rate sensor 42 are fitted to the case of the device main body 31 so as to have such a positional relationship. Therefore, the x-axis of the angular rate sensor 42 matches the fore-and-aft direction of the electric two-wheeled vehicle 1, the y-axis thereof matches the left-right direction of the electric two-wheeled vehicle 1, and the z-axis thereof matches the up-down direction of the electric two-wheeled vehicle 1.

The sound synthesizer circuit 35 estimates a running state of the electric two-wheeled vehicle 1 based on output signals of the sensors 40, and generates an audio signal representing a running-linked sound according to the estimated running state. The audio signal is amplified by the amplifier 36, and the amplified audio signal is provided to the speaker 32 via the wiring 33. As a result, the speaker 32 is driven to produce a running-linked sound. The running-linked sound is produced for people around the electric two-wheeled vehicle 1, and is also heard by the rider. The sound synthesizer circuit 35 is preferably programmed to generate a running-linked sound signal using output signals of only the sensors 40 included in the device main body 31, and is not arranged to be input with signals from sensors provided on the electric two-wheeled vehicle 1 (outside the running-linked sound producing device 30).

The sensors 40 in the device main body 31 may include a GPS (Global Positioning System) receiver 45 (shown by an alternate long and two short dashed line), besides the acceleration sensor 41 and the angular rate sensor 42. The GPS receiver 45 is a device that receives signals from a GPS satellite orbiting the earth and generates position data and the like.

The sound synthesizer circuit 35 includes a microcomputer, and includes a plurality of functional processing units to be realized by arithmetic processing performed by the microcomputer. More specifically, the sound synthesizer circuit 35 includes a vehicle speed estimation unit 37, an accelerator command value estimation unit 38, and a running-linked sound generation unit 39. The vehicle speed estimation unit 37 estimates a vehicle speed of the electric two-wheeled vehicle 1 based on output signals of the sensors 40. That is, the vehicle speed estimation unit 37 estimates a vehicle speed of the electric two-wheeled vehicle 1 without using signals from other sensors equipped on the electric two-wheeled vehicle 1. The accelerator command value estimation unit 38 estimates an accelerator command value based on the vehicle speed estimated by the vehicle speed estimation unit 37 and output signals of the sensors 40. The accelerator command value corresponds to the operation amount of the accelerator grip provided on the handle 11. However, it is not necessary that the estimated accelerator command value accurately corresponds to the operation amount of the accelerator grip. The accelerator command value estimation unit 38 estimates an accelerator command value without using output signals of other sensors (for example, an accelerator grip operation amount sensor) provided on the electric two-wheeled vehicle 1. The running-linked sound generation unit 39 generates a running-linked sound signal based on the vehicle speed estimated by the vehicle speed estimation unit 37 and the accelerator command value estimated by the accelerator command value estimation unit 38.

Figure 3:
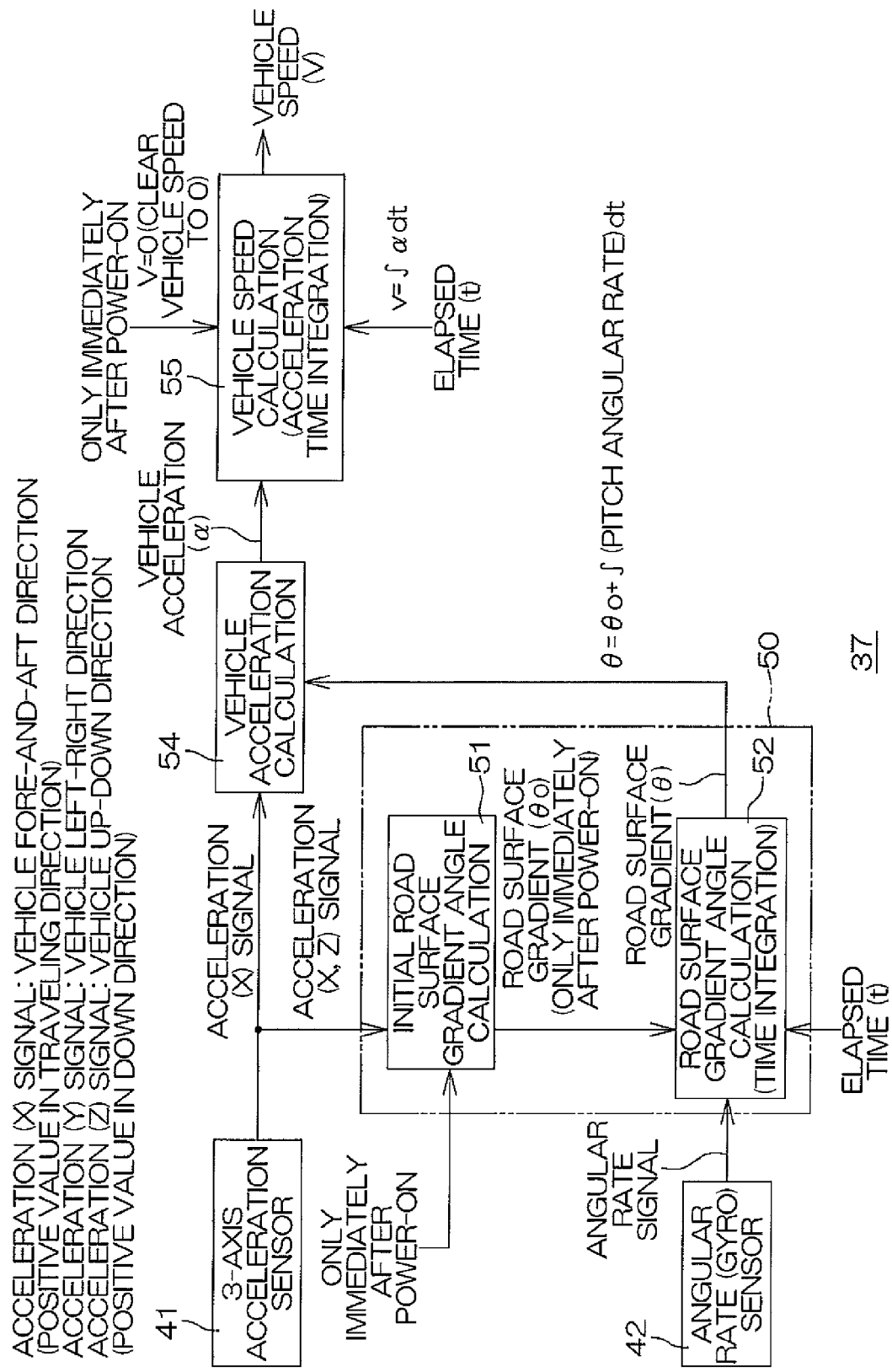
FIG. 3 is a block diagram for explaining a configuration example of a vehicle speed estimation unit.

FIG. 3 is a block diagram for explaining a more detailed configuration example of the vehicle speed estimation unit 37. The vehicle speed estimation unit 37 includes a road surface gradient estimation unit 50, a vehicle acceleration calculation unit 54, and a vehicle speed calculation unit 55. The road surface gradient estimation unit 50 includes a gradient estimating unit programmed to estimate a gradient of a road surface on which the electric two-wheeled vehicle 1 is running, and includes an initial road surface gradient angle calculation unit 51 and a road surface gradient angle calculation unit 52.

The initial road surface gradient angle calculation unit 51, immediately after the running-linked sound producing device 30 is powered on, calculates an initial gradient angle $\theta_0$ of a road surface on which the electric two-wheeled vehicle 1 is placed based on an output signal of the acceleration sensor 41. The running-linked sound producing device 30 may be configured, for example, so as to be powered on simultaneously when the electric two-wheeled vehicle 1 is powered on. The road surface gradient angle calculation unit 52 determines a road surface gradient angle $\theta$ by integrating a pitch angular rate (angular rate about the y-axis) detected by the angular rate sensor 42. More specifically, by time integration of the pitch angular rate after the running-linked sound producing device 30 is powered on with the initial gradient angle $\theta_0$ used as an initial value, a road surface gradient angle θ is determined. That is, θ=θ$_0$+∫ (pitch angular rate) dt (t represents time).

The vehicle acceleration calculation unit 54 includes an acceleration estimating unit programmed to determine a fore-and-aft direction acceleration α of the electric two-wheeled vehicle 1 by applying a correction based on the road surface gradient angle θ to a fore-and-aft direction acceleration (x-axis direction acceleration) detected by the acceleration sensor 41. The vehicle speed calculation unit 55 determines a vehicle speed V of the electric two-wheeled vehicle 1 by time integration of the fore-and-aft direction acceleration α. More specifically, the vehicle speed calculation unit 55 integrates the fore-and-aft direction acceleration α from power-on of the running-linked sound producing device 30. An initial value of integration is made zero (cleared to zero with power-on). That is, V=∫αdt.

Figure 4:
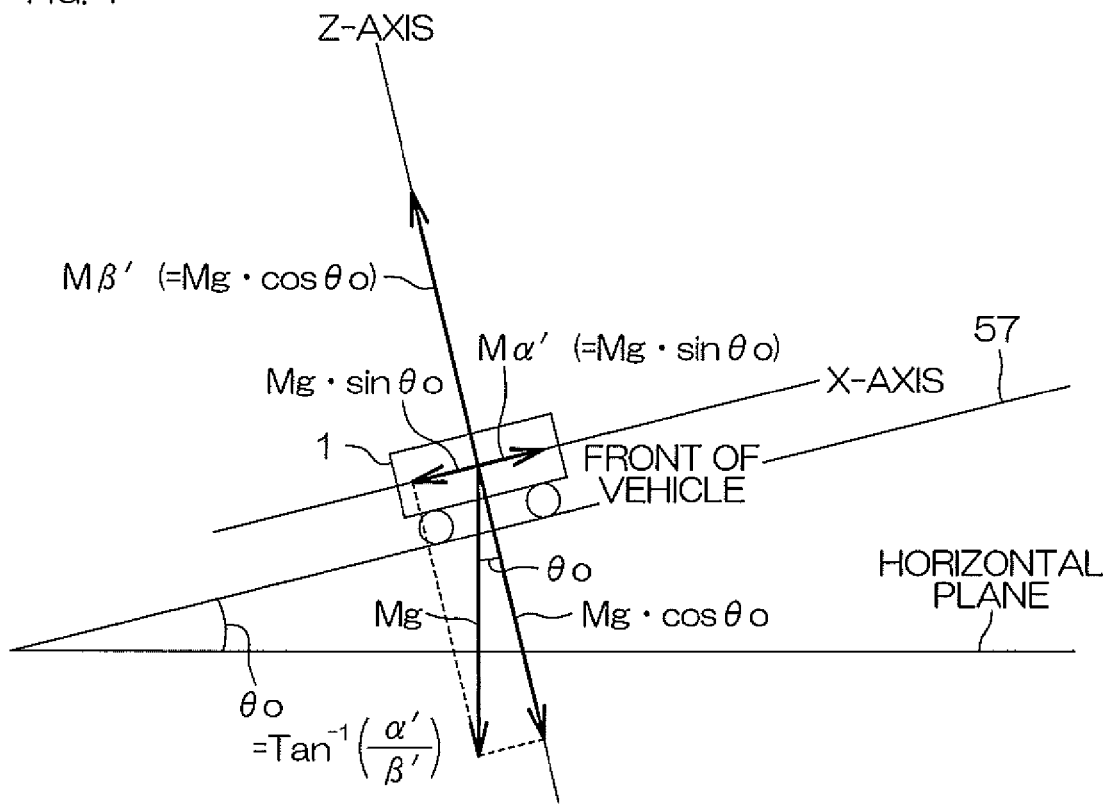
FIG. 4 is an explanatory view showing forces that act on an electric two-wheeled vehicle on an inclined road surface.

FIG. 4 is an explanatory view showing a state immediately after power-on on an inclined road surface 57. On the electric two-wheeled vehicle 1, gravity Mg (g is an acceleration of gravity) proportional to its mass M acts vertically downward. An x-axis direction component of the gravity Mg can be expressed as Mg·sin θ$_0$ by using the initial road surface gradient angle θ$_0$. Moreover, a z-axis direction component can be expressed as Mg·cos θ$_0$ by using the initial road surface gradient angle θ$_0$. The acceleration sensor 41 detects a fore-and-aft direction acceleration, for example, with the front (+X direction, traveling direction) of the electric two-wheeled vehicle 1 set as positive. When the electric two-wheeled vehicle 1 is at a standstill on the road surface 57, an x-axis direction component Mg·sin θ$_0$ (force in a −X direction) of the gravity balances with a force Mα that acts toward the front (+X direction) of the electric two-wheeled vehicle 1 in terms of the x-axis direction. Moreover, in terms of the z-axis direction, the z-axis direction component mg·cos θ$_0$ of the gravity balances with a normal force Mβ'. In this regard, α' represents an x-axis direction acceleration detected by the acceleration sensor 41, and β' represents a z-axis direction acceleration detected by the acceleration sensor 41. When the electric two-wheeled vehicle 1 is at a standstill, its actual acceleration α is zero, but an apparent acceleration α' (=g sin θ$_0$) is detected because of the x-axis direction component Mg·sin θ$_0$ of the gravity.

The acceleration sensor 41 detects the fore-and-aft direction acceleration α' (=g sin θ$_0$) and an up-down direction (z-axis direction) acceleration IP (=g cos θ$_0$) on the inclined road surface 57. Therefore, the initial gradient angle θ$_0$ can be determined as θ$_0$=Tan$^{-1}$ (α'/β'). This calculation is carried out in the initial road surface gradient angle calculation unit 51.

When the electric two-wheeled vehicle 1 is running on the road surface 57 inclined at the road surface gradient angle θ, the fore-and-aft direction acceleration α' to be detected by the acceleration sensor 41 takes a value for which a contribution component g sin θ of the acceleration of gravity g is added to a component of the actual fore-and-aft direction acceleration α of the electric two-wheeled vehicle 1. Accordingly, the vehicle acceleration calculation unit 54 determines the actual fore-and-aft direction acceleration α (=α'−g sin θ) of the electric two-wheeled vehicle 1 by subtracting the contribution component g sin θ of the acceleration of gravity g from the fore-and-aft direction acceleration α' detected by the acceleration sensor 41. That is, the vehicle acceleration calculation unit 54 determines a fore-and-aft direction acceleration α of the electric two-wheeled vehicle 1 by applying a correction according to the road surface gradient angle θ to an output signal of the acceleration sensor 41. It suffices to set the road surface gradient angle θ as positive when it is an elevation with respect to a horizontal plane, and as negative when it is a depression with respect to a horizontal plane, facing in the traveling direction of the electric two-wheeled vehicle 1.

When the electric two-wheeled vehicle 1 is running, the acceleration sensor 41 easily detects a noise component due to road surface unevenness and vibration of the electric two-wheeled vehicle 1, especially, with regard to the z-axis direction. Further, with regard to the x-axis direction, during running, both of an acceleration component due to a road surface inclination and an acceleration component due to a change in vehicle speed are contained in an output signal of the acceleration sensor 41, and it is difficult to distinguish between those components. Therefore, it is not practical to use an output signal of the acceleration sensor 41 to detect the gradient angle θ of a road surface on which the electric two-wheeled vehicle 1 is running. Accordingly, in the present preferred embodiment, the road surface gradient angle θ is determined, after calculating the initial road surface gradient angle θ$_0$ based on an output signal of the acceleration sensor 41, by time integration of a pitch angular rate output by the angular rate sensor 42 with the initial road surface gradient angle θ$_0$ used as an initial value of integration. Such an integration operation is carried out by the road surface gradient angle calculation unit 52. The road surface gradient angle θ thus determined is supplied to the vehicle acceleration calculation unit 54 for a correction of an output signal of the acceleration sensor 41.

The vehicle speed calculation unit 55 determines a vehicle speed V by time integration of a fore-and-aft direction acceleration α obtained by a correction operation by the vehicle acceleration calculation unit 54.

Figure 5:
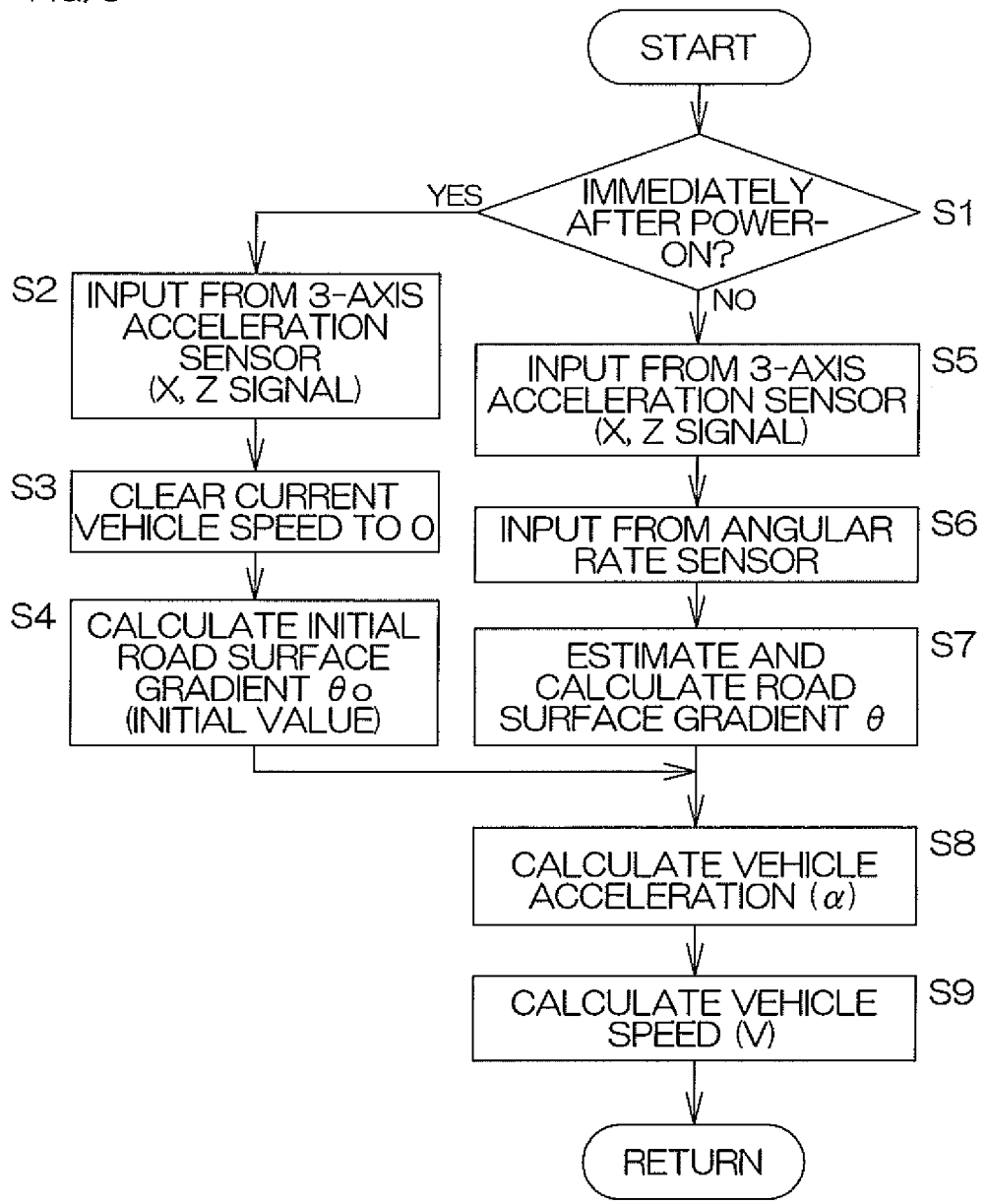
FIG. 5 is a flowchart showing the content of processing by the vehicle speed estimation unit.

FIG. 5 is a flowchart showing the content of processing by the vehicle speed estimation unit 37.

The vehicle speed estimation unit 37 judges whether it is immediately after power-on (step S1). When it is immediately after power-on, the vehicle speed estimation unit 37 reads in an output signal of the acceleration sensor 41 (step S2), and clears the vehicle speed V to zero (step S3). Further, the vehicle speed estimation unit 37 calculates an initial road surface gradient angle θ$_0$ based on a fore-and-aft direction acceleration α' and an up-down direction acceleration β' taken in from the acceleration sensor 41 (step S4). The operation of steps S2 to S4 is carried out only once immediately after power-on.

When it is not immediately after power-on (step S1: NO), the vehicle speed estimation unit 37 reads in output signals of the acceleration sensor 41 and the angular rate sensor 42 (steps S5, S6). Then, the vehicle speed estimation unit 37 determines a gradient angle θ of a road surface on which the electric two-wheeled vehicle 1 is running by integrating the output signal of the angular rate sensor 42 (step S7). Further, the vehicle speed estimation unit 37 determines an actual fore-and-aft direction acceleration α of the electric two-wheeled vehicle 1 by correcting the fore-and-aft direction acceleration α' (compensating for an acceleration of gravity component) output by the acceleration sensor 41 using the determined road surface gradient angle θ (step S8). Further, the vehicle speed estimation unit 37 determines a current vehicle speed V of the electric two-wheeled vehicle 1 by time integration of the fore-and-aft direction acceleration α (step S9).

Thereafter, the operation of steps S1 to S9 is repeated until the power is shut off and the system stops.

Figure 6:
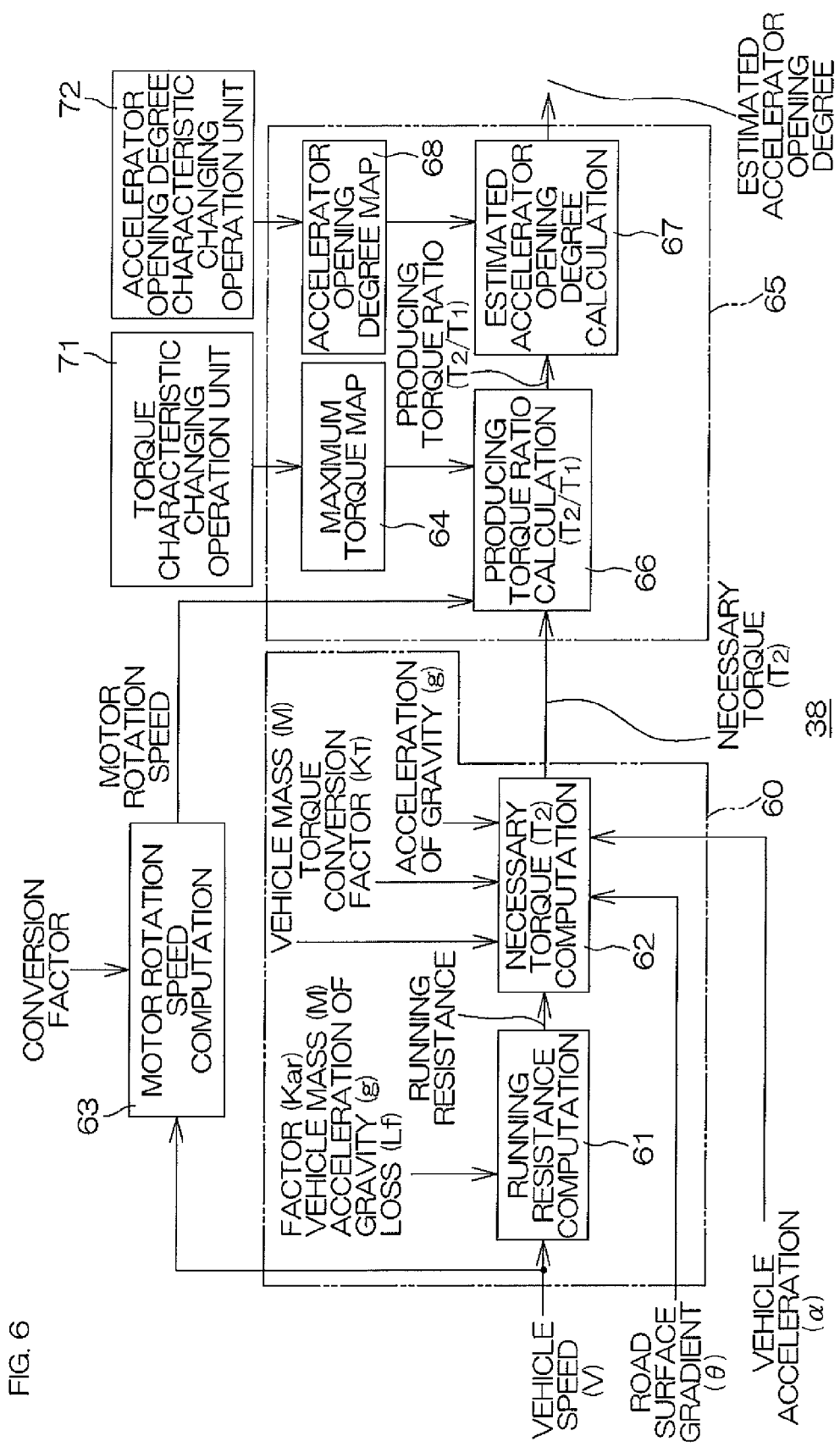
FIG. 6 is a block diagram for explaining a configuration example of an accelerator command value estimation unit.

FIG. 6 is a block diagram for explaining a configuration example of the accelerator command value estimation unit 38. The accelerator command value estimation unit 38 includes a torque estimation unit 60, a motor rotation speed computing unit 63, and an accelerator opening degree estimation unit 65. The torque estimation unit 60 includes a running resistance computing unit 61 and a necessary torque computing unit 62. The accelerator opening degree estimation unit 65 includes a producing torque ratio calculation unit 66 and an estimated accelerator opening degree calculation unit 67.

The motor rotation speed computing unit 63 includes a motor rotation speed estimating unit and is programmed to compute a motor rotation speed based on a vehicle speed V estimated by the vehicle speed estimation unit 37 and a predetermined conversion factor. The conversion factor is a constant determined based on a reduction ratio and the perimeter of the rear wheel 4, and is provided from a storage unit (memory) built in the sound synthesizer circuit 35. By dividing the vehicle speed V by the perimeter of the rear wheel 4, the rotation speed (number of revolutions per unit time) of the rear wheel 4 is determined. Further, by multiplying the rotation speed of the rear wheel 4 by the reduction ratio, the rotation speed of the electric motor 5 is determined. The reduction ratio means a ratio between the rotation speed of the electric motor 5 and the rotation speed of the rear wheel 4 (electric motor rotation speed/rear wheel rotation speed). Therefore, it suffices to determine the conversion factor, for example, so as to be proportional to a product of a reciprocal of the perimeter of the rear wheel 4 and the reduction ratio. The computed motor rotation speed is provided to the producing torque ratio calculation unit 66.

The running resistance computing unit 61 calculates an external force (running resistance) that hinders the electric two-wheeled vehicle 1 traveling when the electric two-wheeled vehicle 1 is caused to run. Examples of running resistance components include an air resistance, a resistance due to tire deformation, and a resistance due to the viscosity of oil in the electric motor 5. The air resistance, which is proportional to the second power of the vehicle speed V, can thus be expressed as $Kar \cdot V^2$ by using a factor Kar. Other running resistance components can be collectively expressed by a constant Lf. In the storage unit (memory) included in the sound synthesizer circuit 35, the factor Kar, the mass M of the electric two-wheeled vehicle 1, the acceleration of gravity g, and the constant Lf are written in advance. By using these constants and the vehicle speed V estimated by the vehicle speed estimation unit 37, the running resistance computing unit 61 computes the running resistance=$Kar \cdot V^2 + Lf$. The running resistance value is provided to the necessary torque computing unit 62.

The necessary torque computing unit 62 computes torque that needs to be produced by the electric motor 5. When the electric two-wheeled vehicle 1 is running at the acceleration α on a road surface with the road surface gradient angle θ, a force F to push the electric two-wheeled vehicle 1 in its traveling direction is given by F=running resistance+$Mg \cdot \sin \theta + M \cdot \alpha$. $Mg \cdot \sin \theta$ represents a resistance component due to a road surface inclination, and is called a gradient resistance. $M \cdot \alpha$ represents an acceleration resistance. Where a torque conversion factor of the electric motor 5 is $K_T$ and necessary torque that needs to be produced by the electric motor 5 is $T_2$, $F = K_T \cdot T_2$ holds. Therefore, the necessary torque $T_2$ is $T_2 = F/K_T =$ (running resistance+$Mg \cdot \sin \theta + M \cdot \alpha$)$/K_T$. This computation is carried out in the necessary torque computing unit 62. The computed necessary torque $T_2$ is provided to the producing torque ratio calculation unit 66. The mass M, acceleration of gravity g, and torque conversion factor $K_T$ necessary for calculation of the necessary torque $T_2$ are provided from the storage unit (memory) included in the sound synthesizer circuit 35.

Figure 7:
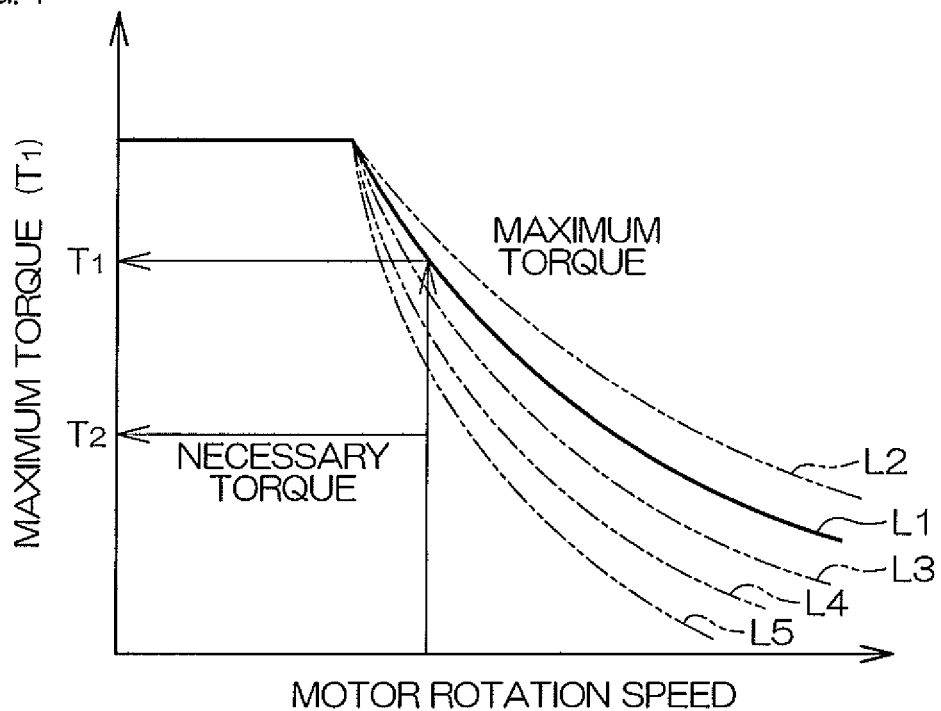
FIG. 7 shows an example of a maximum torque map representing the relationship between the motor rotation speed and maximum torque.

The producing torque ratio calculation unit 66 computes a producing torque ratio based on the necessary toque $T_2$ and a motor rotation speed. The producing torque ratio means a ratio ($T_2/T_1$) of the necessary torque $T_2$ to the maximum torque $T_1$ that can be produced by the electric motor 5 at the motor rotation speed. The maximum torque $T_1$ is provided from a maximum torque map 64. An example of the maximum torque map 64 is shown in FIG. 7. That is, the maximum torque map 64 is defined by a data group (table) that stores a maximum torque map with respect to the motor rotation speed. The curve L1 shows actual torque characteristics of the electric motor 5. The larger the motor rotation speed, the more the maximum torque $T_1$ decreases because of a back electromotive force. The electric motor 5 is capable of producing torque in a range not more than the maximum torque $T_1$ according to the motor rotation speed. The producing torque ratio calculation unit 66 reads out the maximum torque $T_1$ corresponding to the motor rotation speed from the maximum torque map 64, and computes a producing torque ratio $T_2/T_1$ using the read-out maximum torque $T_1$.

Because the maximum torque map stored in the maximum torque map 64 is used only for production of a running-linked sound, it is not necessary that the maximum torque map shows actual characteristics of the electric motor 5. That is, as shown by the curves L2, L3, L4, and L5 in FIG. 7, it may be as well to compute the producing torque ratio $T_2/T_1$ using a torque characteristic curve different from that showing actual characteristics of the electric motor 5. For example, a plurality of torque characteristic curves L1 to L5 may be stored in the maximum torque map 64 so as to allow use while switching these curves by an operation from a torque characteristic changing operation unit 71 (refer to FIG. 6). As a result, characteristics of the sound synthesizer circuit 35 can be changed (tuned) according to characteristics of the electric two-wheeled vehicle 1 and user preference. Further, changing characteristics of the maximum torque by an operation of the torque characteristic changing operation unit 71 makes it also possible to be compatible with a motor having any torque characteristics. Thus, the torque characteristic changing operation unit 71 includes a motor characteristic changing unit programmed to change characteristics of the maximum torque with respect to the motor rotation speed.

Figure 8:
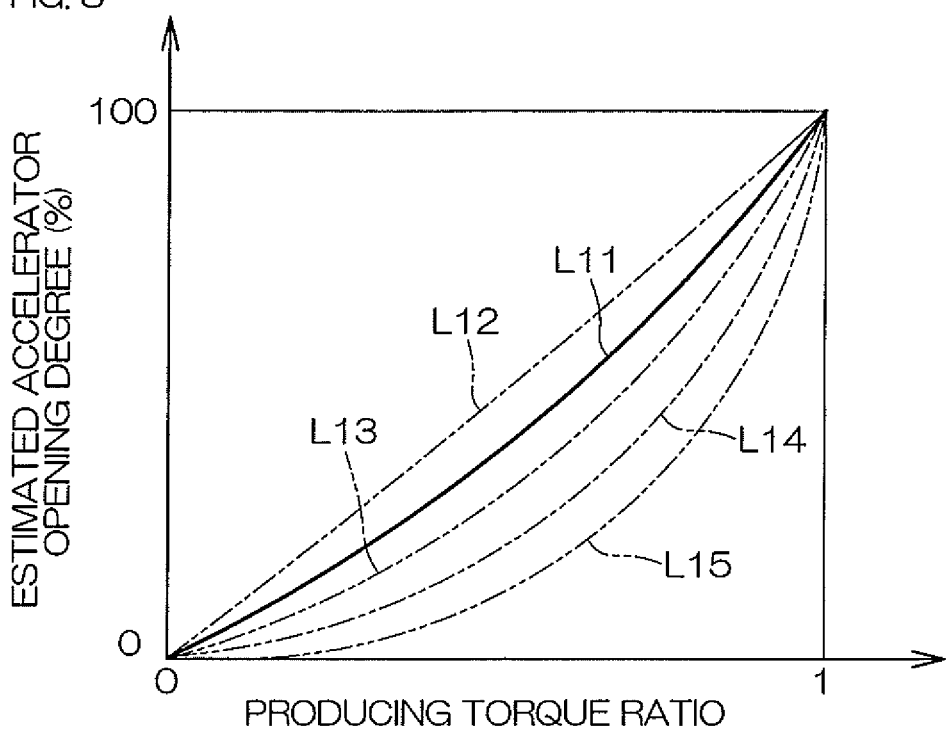
FIG. 8 shows an example of an accelerator opening degree map representing the relationship of the estimated accelerator opening degree with respect to the producing torque ratio.

The producing torque ratio $T_2/T_1$ thus determined is provided to the estimated accelerator opening degree calculation unit 67. The estimated accelerator opening degree calculation unit 67 determines an estimated accelerator opening degree as an accelerator command value with reference to an accelerator opening degree map 68. An example of the accelerator opening degree map 68 is shown in FIG. 8. The accelerator opening degree map 68 is defined by a data group (table) that stores an estimated accelerator opening degree (%) with respect to the producing torque ratio. The accelerator opening degree means a ratio of an actual operation amount of the accelerator grip with respect to the whole operation amount. The accelerator opening degree characteristic curve L11 shows characteristics simulating an actual relationship between the producing torque ratio and accelerator opening degree. The larger the producing torque ratio, the larger the estimated accelerator opening degree. The estimated accelerator opening degree calculation unit 67 reads out an estimated accelerator opening degree corresponding to the production ratio from the accelerator opening degree map 68, and outputs the read-out estimated accelerator opening degree.

Because the accelerator opening degree map stored in the accelerator opening degree map 68 is used only for production of a running-linked sound, it is not necessary that the accelerator opening degree map always simulates actual accelerator opening degree characteristics. That is, as shown by the curves L12, L13, L14, and L15, it may be as well to determine the estimated accelerator opening degree using an accelerator opening degree characteristic curve different from that showing actual accelerator opening degree characteristics. For example, a plurality of accelerator opening degree characteristic curves L11 to L15 may be stored in the accelerator opening degree map 68 so as to allow use while switching these curves by an operation from an accelerator opening degree characteristic changing operation unit 72 (refer to FIG. 6). As a result, characteristics of the sound synthesizer circuit 35 can be changed (tuned) according to characteristics of the electric two-wheeled vehicle 1 and user preference. Thus, the accelerator opening degree characteristic changing operation unit 72 includes an accelerator characteristic changing unit programmed to change characteristics of the accelerator command value with respect to the producing torque ratio.

Figure 9:
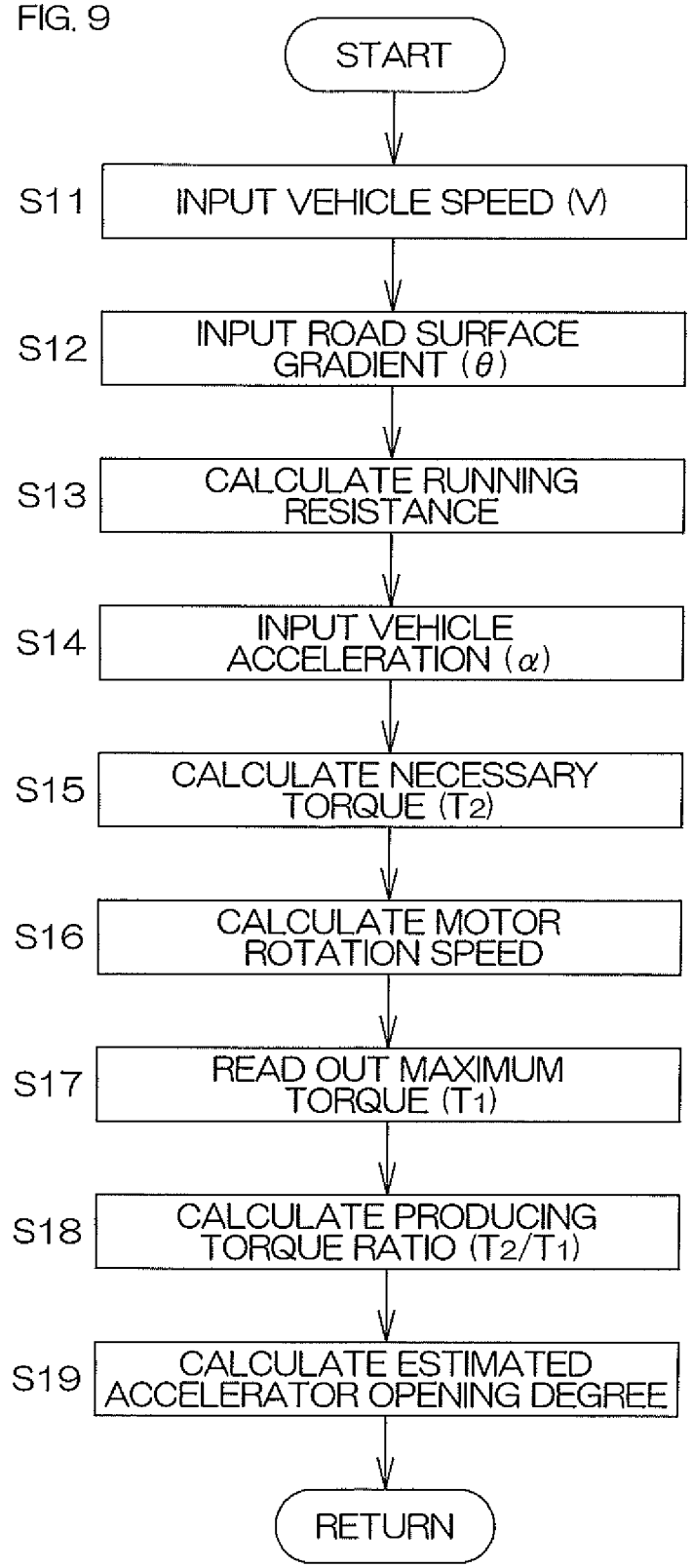
FIG. 9 is a flowchart showing a processing by the accelerator command value estimation unit.

FIG. 9 is a flowchart collectively showing a processing by the accelerator command value estimation unit 38. The accelerator command value estimation unit 38 reads in a vehicle speed V estimated by the vehicle speed estimation unit 37 and a road surface gradient angle θ estimated by the road surface gradient estimation unit 50 (steps S11, S12). Further, the accelerator command value estimation unit 38, based on the vehicle speed V and the road surface gradient angle θ, calculates a running resistance (step S13). Further, the accelerator command value estimation unit 38 reads in a fore-and-aft direction acceleration α to which a correction regarding a road surface gradient has been applied by the vehicle acceleration calculation unit 54 (step S14). Then, the accelerator command value estimation unit 38 determines a necessary torque $T_2$ based on the fore-and-aft direction acceleration α, the running resistance, and the road surface gradient angle θ (step S15). On the other hand, the accelerator command value estimation unit 38 determines a motor rotation speed based on the vehicle speed V (step S16). Then, the accelerator command value estimation unit 38 reads out the maximum torque $T_1$ from the maximum torque map 64 based on the determined motor rotation speed (step S17), and calculates a producing torque ratio $T_2/T_1$ using the same (step S18). Further, the accelerator command value estimation unit 38 determines an estimated accelerator opening degree as an estimated accelerator command value by making reference to the accelerator opening degree map 68 using the producing torque ratio $T_2/T_1$ (step S19). This operation is repeated until the system stops due to power-off.

Figure 10:
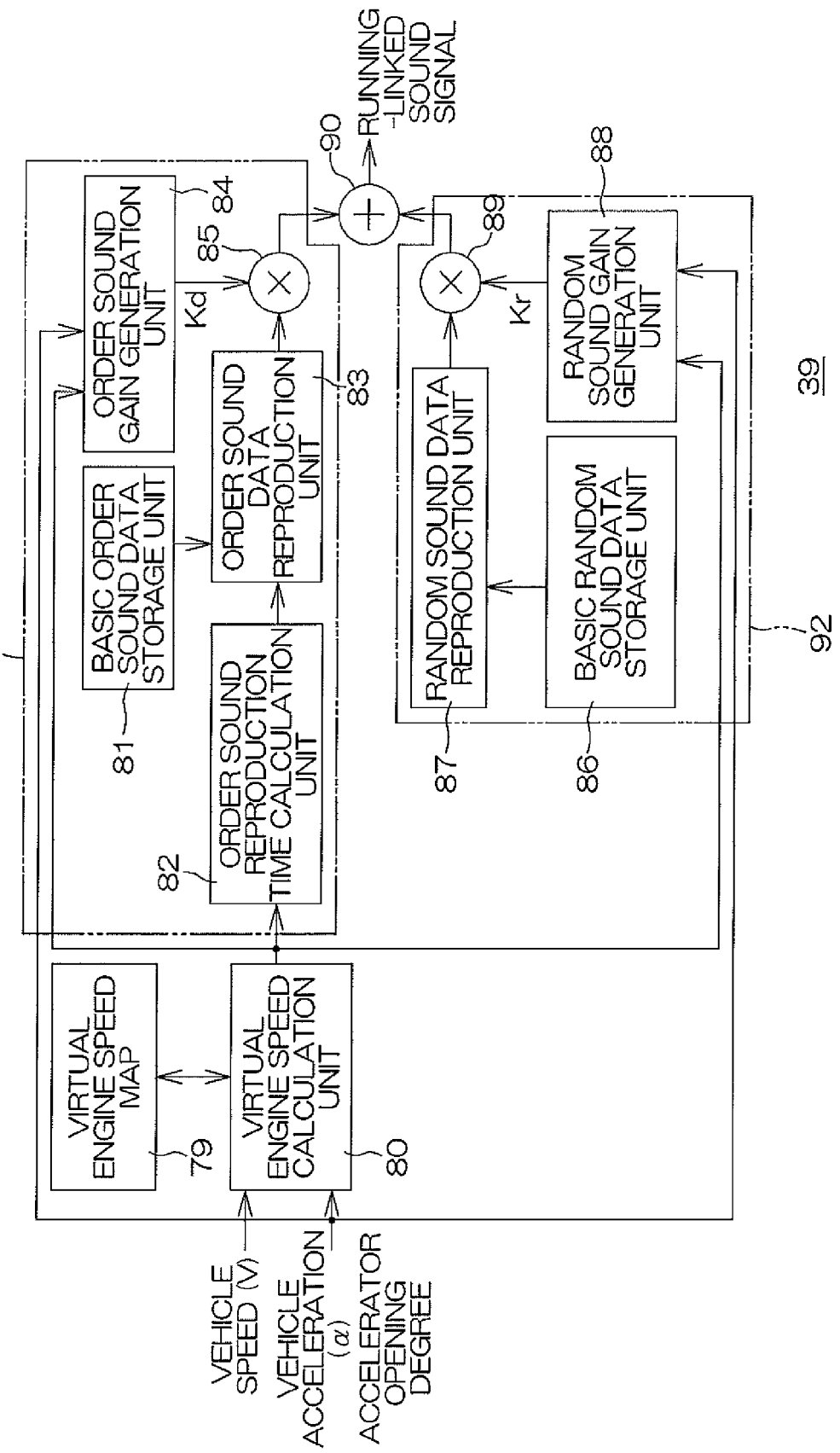
FIG. 10 is a block diagram showing a configuration example of a running-linked sound generation unit.

FIG. 10 is a block diagram showing a configuration example of the running-linked sound generation unit 39. The running-linked sound generation unit 39 uses a vehicle speed V estimated by the vehicle speed estimation unit 37, a vehicle acceleration α calculated by the vehicle acceleration calculation unit 54, and an estimated accelerator opening degree determined by the accelerator command value estimation unit 38. The running-linked sound generation unit 39 using the above produces a running-linked sound signal according to a running state of the electric two-wheeled vehicle 1.

In the present preferred embodiment, a virtual engine (internal combustion engine) whose operating state changes according to the running state of the electric two-wheeled vehicle 1 is assumed, and an engine sound that needs to be produced by the virtual engine according to its operating state is synthesized as a running-linked sound. Further, in the present preferred embodiment, an engine sound is divided and handled as a plurality of components. Specifically, engine sound data is divided and handled as an order sound component being a first component and a random sound component being a second component. The order sound component means a sound component, of an engine sound (or a sound produced by a vehicle powered by an engine), whose frequency (or frequency spectrum) fluctuates according to the engine speed. The random sound component means a component, of an engine sound (or a sound produced by a vehicle powered by an engine), whose frequency (or frequency spectrum) does not substantially fluctuate regardless of the engine speed.

The running-linked sound generation unit 39 includes a virtual engine speed calculation unit 80 as an example of a motor rotation speed estimating unit, an order sound data generation unit 91, a random sound data generation unit 92, and a synthesis unit 90.

The virtual engine speed calculation unit 80 calculates a rotation speed of the virtual engine based on a vehicle speed V estimated by the vehicle speed estimation unit 37, an estimated accelerator opening degree estimated by the accelerator command value estimation unit 38, and a vehicle acceleration α calculated by the vehicle acceleration calculation unit 54. More specifically, the virtual engine speed calculation unit 80 makes reference to the virtual engine speed map 79 based on the vehicle speed V, the estimated accelerator opening degree, and the vehicle acceleration α, and reads out a corresponding virtual engine speed from the virtual engine speed map 79. The read-out virtual engine speed is provided to the order sound data generation unit 91.

The order sound data generation unit 91 includes a first component sound data generating unit programmed to generate order sound data, of an engine sound, representing an order sound component as a first component. The order sound data generation unit 91 includes a basic order sound data storage unit 81, an order sound reproduction time calculation unit 82, an order sound data reproduction unit 83, an order sound gain generation unit 84, and an order sound gain multiplication unit 85. The basic order sound data storage unit 81 stores, as first component basic sound data, basic order sound data prepared in advance. The basic order sound data is data representing only an order sound component of an engine sound generated when the virtual engine is rotating at a basic rotation speed (for example, 3000 rpm), and has a certain length of time (basic reproduction time). The basic order sound data may be prepared by processing sound data recorded from an actual engine, or may be sound data prepared by a computer to resemble actual order sound data without using data recorded from an actual engine. However, it is preferable that the basic order sound data contains as small a random sound component as possible. That is, it is preferable that the basic order sound data does not contain a random sound component at all or is sound data with a random sound component reduced.

The order sound reproduction time calculation unit 82 calculates a reproduction time of basic order sound data based on a virtual engine speed. The reproduction time is calculated by the following formula.

$$\text{Reproduction time} = \text{Basic reproduction time} \times \text{Basic rotation speed} / \text{Virtual engine speed}.$$

That is, the reproduction time of basic order sound data is determined by modifying the basic reproduction time so as to be inversely proportional to the virtual engine speed. Therefore, the reproduction time is short at high-speed rotation (that is, at high-speed running), and the reproduction time is long at low-speed rotation (that is, at low-speed running).

The order sound data reproduction unit 83 reads out basic order sound data from the basic order sound data storage unit 81, and repeatedly reproduces (loop-reproduces) the basic order sound data with a reproduction time calculated by the order sound reproduction time calculation unit 82. The shorter the production time, the higher the tone of a sound to be reproduced, and the longer the reproduction time, the lower the tone of a sound to be reproduced. Therefore, an order sound with a high tone can be generated at high-speed rotation, and an order sound with a low tone can be generated at low-speed rotation. That is, the order sound reproduction time calculation unit 82 and the order sound data reproduction unit 83 constitute a tone changing unit programmed to change the tone of an order sound component according to a virtual engine speed. The basic order sound data repeatedly reproduced by the order sound data reproduction unit 83 is provided to the order sound gain multiplication unit 85.

The order sound gain multiplication unit 85 generates volume-adjusted order sound data by multiplying repeatedly reproduced basic order sound data by an order sound gain generated by the order sound gain generation unit 84. The order sound data is provided to the synthesis unit 90. The order sound gain generation unit 84 generates an order sound gain according to an accelerator opening degree and a virtual engine speed. Therefore, the volume of an order sound component changes according to the accelerator opening degree and virtual engine speed. That is, the order sound gain generation unit 84 and the order sound gain multiplication unit 85 constitute an order sound component volume changing unit programmed to change the volume of an order sound component according to a virtual engine speed and an accelerator opening degree.

The random sound data generation unit 92 includes a second component sound data generating unit programmed to generate random sound data, of an engine sound, representing a random sound component as a second component. The random sound data generation unit 92 includes a basic random sound data storage unit 86, a random sound data reproduction unit 87, a random sound gain generation unit 88, and a random sound gain multiplication unit 89. The basic random sound data storage unit 86 stores, as second component basic sound data, basic random sound data prepared in advance. The basic random sound data is data representing only a random sound component of an engine sound generated when the virtual engine is rotating at a basic rotation speed (for example, 3000 rpm), and has a certain length of time (basic reproduction time). The basic random sound data may be prepared by processing sound data recorded from an actual engine, or may be sound data prepared by a computer to resemble actual random sound data without using data recorded from an actual engine. However, it is preferable that the basic random sound data contains as small an order sound component as possible. That is, it is preferable that the basic random sound data does not contain an order sound component at all or is sound data with an order sound component reduced.

The random sound data reproduction unit 87 reads out basic random sound data from the basic random sound data storage unit 86, and repeatedly reproduces the basic random sound data with a basic reproduction time. Because the basic random sound data is always reproduced with the basic reproduction time, its tone does not change. The basic random sound data repeatedly reproduced by the random sound data reproduction unit 87 is provided to the random sound gain multiplication unit 89. The random sound gain multiplication unit 89 generates volume-adjusted random sound data by multiplying repeatedly reproduced basic random sound data by a random sound gain generated by the random sound gain generation unit 88. The random sound data is provided to the synthesis unit 90. The random sound gain generation unit 88 generates a random sound gain according to an accelerator opening degree and a virtual engine speed. Therefore, the volume of a random sound component changes according to the accelerator opening degree and virtual engine speed. That is, the random sound gain generation unit 88 and the random sound gain multiplication unit 89 constitute a random sound component volume changing unit programmed to change the volume of a random sound component according to a virtual engine speed and an accelerator opening degree.

The synthesis unit 90 includes a synthetic sound data generating unit programmed to synthesize, by superimposing, order sound data generated by the order sound data generation unit 91 and random sound data generated by the random sound data generation unit 92, and to generate synthetic engine sound data (running-linked sound signal). The synthetic engine sound data is provided to the amplifier 36 and amplified. The amplifier 36 converts the synthetic engine sound data to an analog signal, and amplifies the analog signal to generate an audio signal to drive the speaker 32.

Figure 11A:
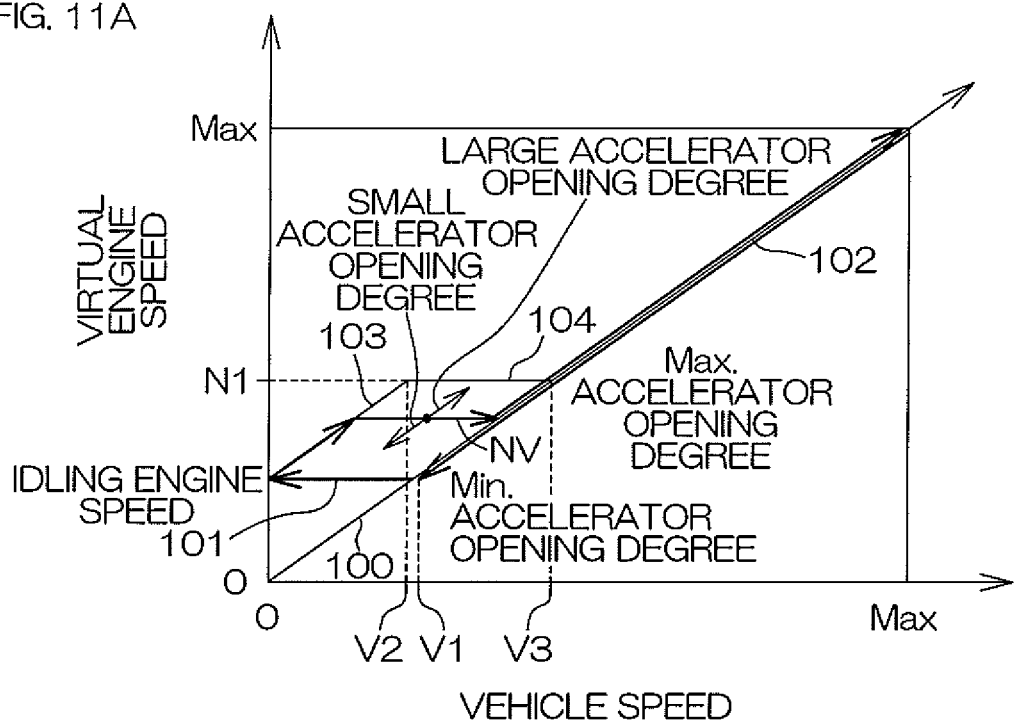
FIG. 11A shows an example of a virtual engine speed map.

FIG. 11A shows an example of the virtual engine speed map 79. In this example, the virtual engine speed map includes a first section 101 in which the virtual engine speed is constant at an idling engine speed from a vehicle speed of zero to a first vehicle speed threshold V1, and a linear second section 102 that is continuous from the first section 101 at the first vehicle speed threshold V1 and extending along a basic line 100 proportional to the vehicle speed. Further, the virtual engine speed map includes a linear third section 103 in which the virtual engine speed increases with the vehicle speed at a constant change rate from the idling engine speed in a section from a vehicle speed of zero to a second vehicle speed threshold V2. The virtual engine speed map further includes a fourth section 104 that is continuous from the third section 103 at the second vehicle speed threshold V2, keeping a constant virtual engine speed N1 regardless of the vehicle speed, and continuous to the second section 102 at a third vehicle speed threshold V3.

When the vehicle acceleration α is negative, that is, at the time of deceleration, a virtual engine speed along the first section 101 and the second section 102 is read out based on a current vehicle speed V. On the other hand, when the vehicle acceleration α is positive, that is, at the time of acceleration, and with a vehicle speed of the third vehicle threshold V3 or more, a virtual engine speed along the second section 102 is read out based on a current vehicle speed. In contrast thereto, when the vehicle is accelerating at a vehicle speed V less than the third vehicle speed threshold V3, a virtual engine speed is determined in accordance with a constant engine speed line NV that is obtained by prorating a section between the first section 101 and the fourth section 104 according to an accelerator opening degree with regard to the engine speed coordinate axis direction.

Figure 11B:
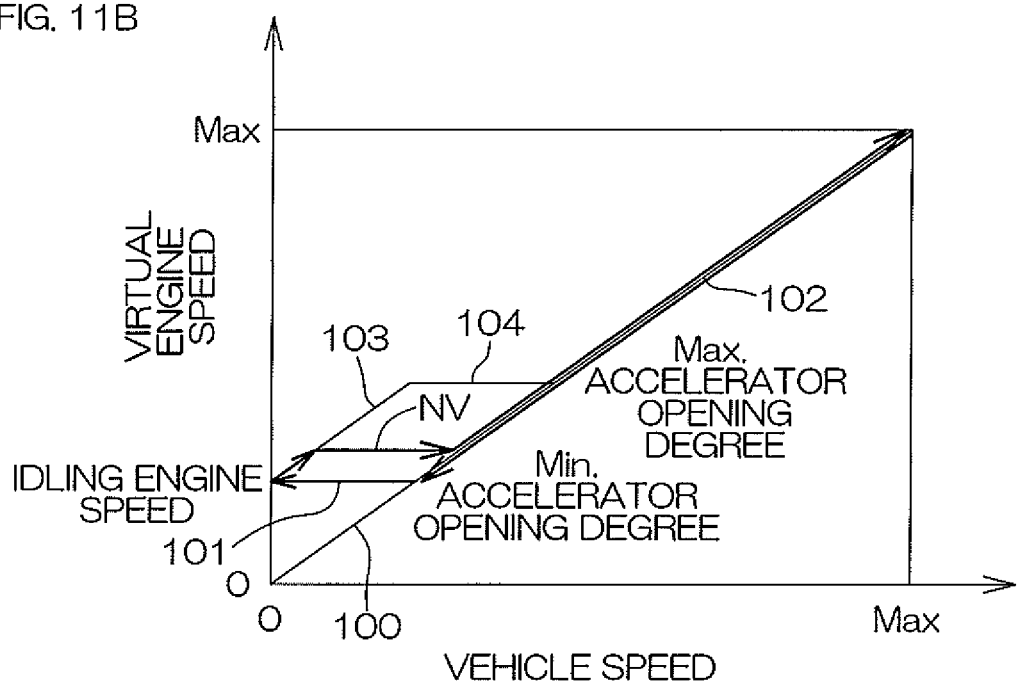
FIG. 11B shows a constant engine speed line when an electric two-wheeled vehicle is accelerating in a state with a relatively small value of the accelerator opening degree.

FIG. 11B shows a constant engine speed line NV when the electric two-wheeled vehicle 1 is accelerating in a state with a relatively small value of the accelerator opening degree. The constant engine speed line NV in this case is set at a position close to the first section 101, and is defined by a segment showing a constant virtual engine speed regardless of the vehicle speed V. The constant engine speed line NV is continuous at its low-speed side end from the third section 103, and is continuous at its high-speed side end to the second section 102. Therefore, when the electric two-wheeled vehicle 1 accelerates from a stopped state, the virtual engine speed is first determined in accordance with the third section 103, and then the virtual engine speed is determined in accordance with the constant engine speed line NV. When the vehicle is further accelerated, the virtual engine speed is determined in accordance with the second section 102. The constant engine speed line NV when the accelerator opening degree is 0% is coincident with the first section 101.

Figure 11C:
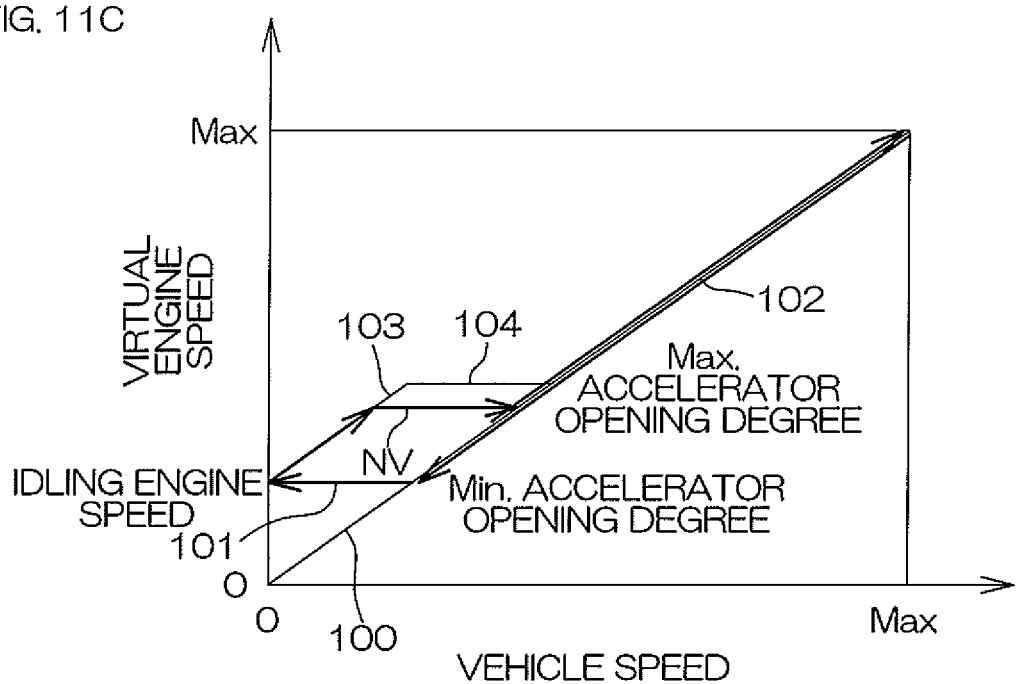
FIG. 11C shows a constant engine speed line when an electric two-wheeled vehicle is accelerating in a state with a relatively large accelerator opening degree.

FIG. 11C shows a constant engine speed line NV when the electric two-wheeled vehicle 1 is accelerating in a state with a relatively large accelerator opening degree. The constant engine speed line NV in this case is set at a position close to the fourth section 104, and is defined by a segment showing a constant virtual engine speed regardless of the vehicle speed V. The constant engine speed line NV is continuous at its low-speed side end from the third section 103, and is continuous at its high-speed side end to the second section 102. The constant engine speed line NV when the accelerator opening degree is 100% is coincident with the fourth section 104.

When the vehicle acceleration α is zero, that is, during constant-speed running, a virtual engine speed is determined in accordance with a characteristic line that is referred to at that point in time for determination of a virtual engine speed.

Figure 11D:
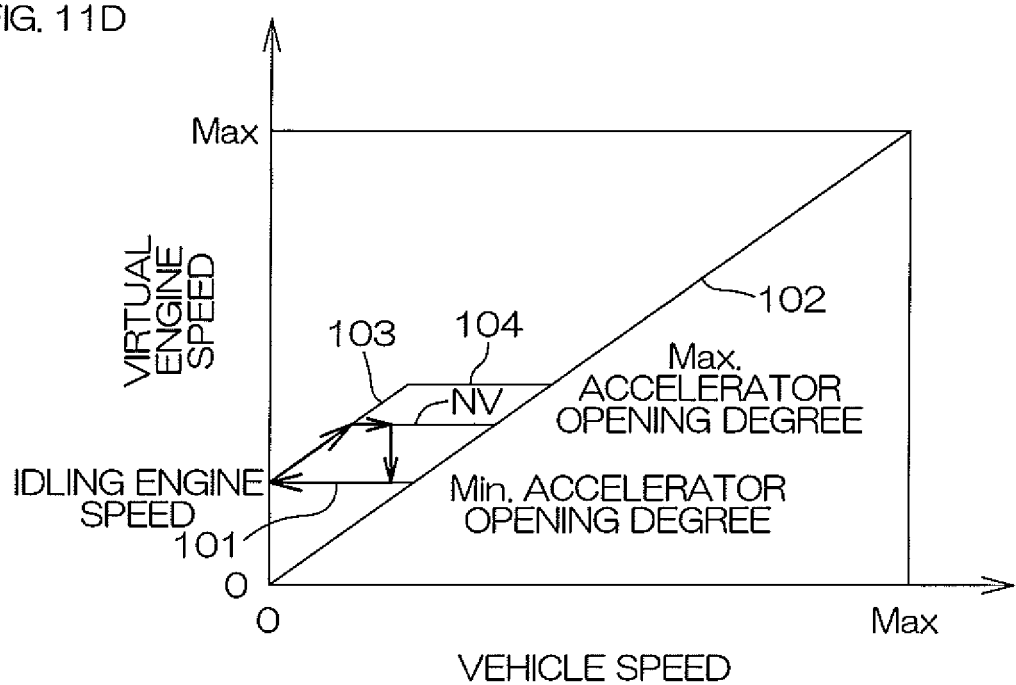
FIG. 11D shows an operation when the vehicle acceleration has changed from a positive value to a negative value in determination of a virtual engine speed in accordance with a constant engine speed line.
Figure 11E:
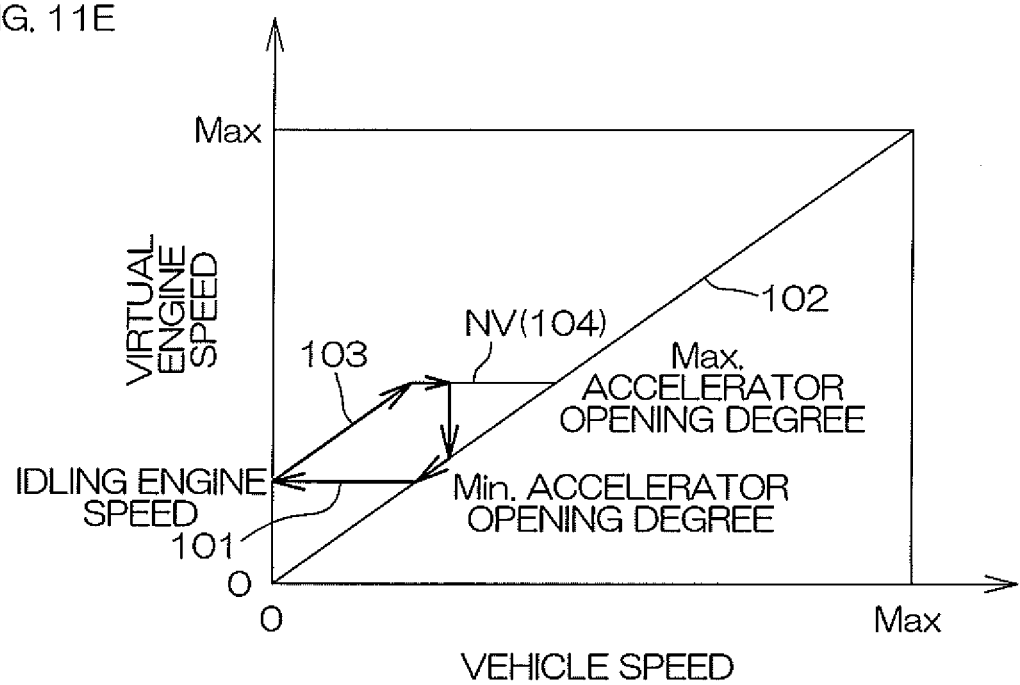
FIG. 11E shows an operation when the vehicle acceleration has changed from a positive value to a negative value in determination of a virtual engine speed in accordance with a constant engine speed line.

FIG. 11D and FIG. 11E show operations when the vehicle acceleration α has changed from a positive value to a negative value in determination of a virtual engine speed in accordance with a constant engine speed line NV. In this case, at a point in time where the vehicle acceleration α has changed to a negative value, the characteristic line that needs to be referred to is switched from the constant engine speed line NV to the first section 101 or the second section 102 according to a vehicle speed V at that time.

Figure 11F:
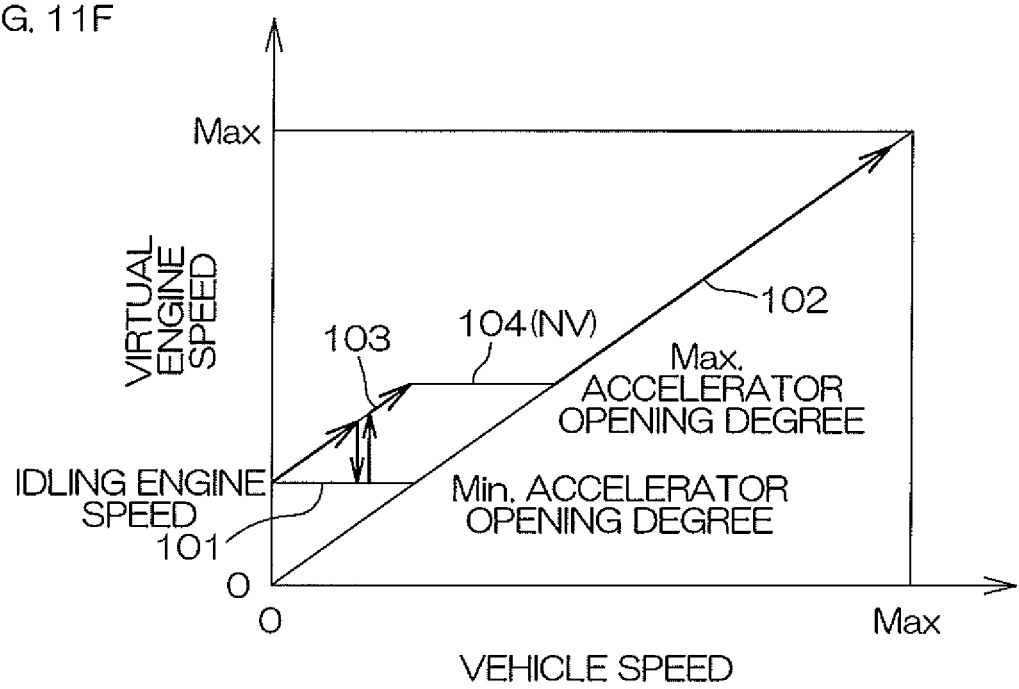
FIG. 11F shows behavior when the vehicle acceleration has once changed to a negative value, and then changed to a positive value.

FIG. 11F shows behavior when the vehicle acceleration α has once changed to a negative value from a state of determining a virtual engine speed in accordance with the third section 103, and then the vehicle acceleration α has changed to a positive value. That is, it corresponds to a case where the electric two-wheeled vehicle 1 in acceleration once changes to deceleration, and then again changes to acceleration as a result of the accelerator opening degree being maximized (100%). In this case, the characteristic line that needs to be referred to is once switched to the first section 101 from a state of determining a virtual engine speed with reference to the third section 103, and then the third section 103 again serves as a referring characteristic line.

Figure 12:
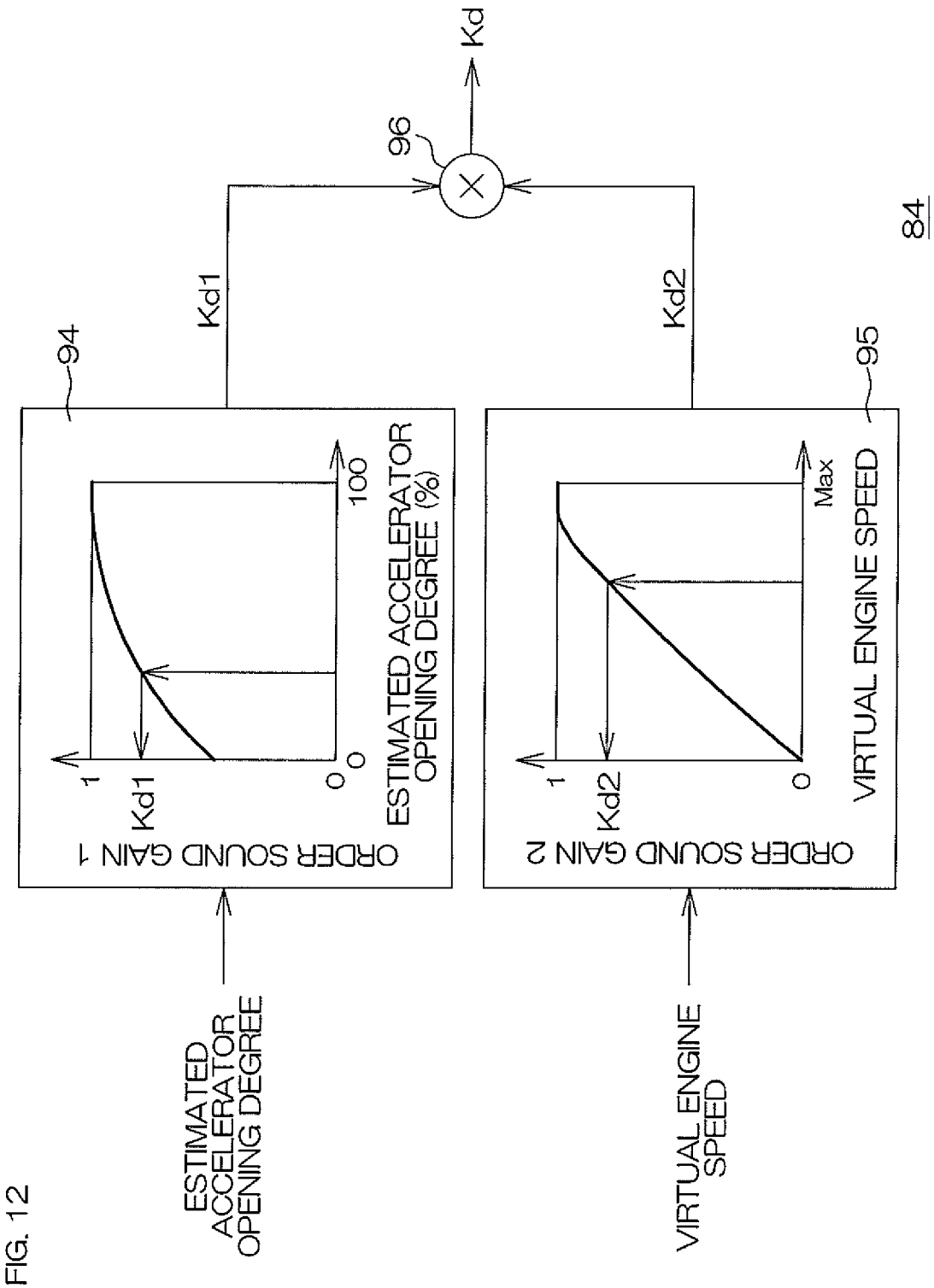
FIG. 12 is a view for explaining a configuration example of an order sound gain generation unit.

FIG. 12 is a view for explaining a configuration example of the order sound gain generation unit 84. The order sound gain generation unit 84 includes a first order sound gain setting unit 94, a second order sound gain setting unit 95, and a multiplication unit 96. The first order sound gain setting unit 94 sets a first order sound gain $K_{d1}$ according to the accelerator opening degree. The second order sound gain setting unit 95 sets a second order sound gain $K_{d2}$ according to the virtual engine speed. The multiplication unit 96 determines an order sound gain $K_d$ ($=K_{d2} \times K_{d2}$) by multiplying the first order sound gain $K_{d1}$ and the second order sound gain $K_{d2}$ by each other. The order sound gain $K_d$ is provided to the order sound gain multiplication unit 85 (refer to FIG. 10).

The first order sound gain $K_{d1}$ is set, for example, in accordance with a characteristic curve (map data) that monotonously increases from the minimum value larger than 0 to the maximum value "1" when the estimated accelerator opening degree increases from 0% to 100%. In the example of FIG. 12, the first order sound gain $K_{d1}$ is set so as to nonlinearly and monotonously increase with an increase in the estimated accelerator opening degree, and its rate of increase is smaller as the estimated accelerator opening degree is larger.

The second order sound gain $K_{d2}$ is set, for example, in accordance with a characteristic curve (map data) that monotonously increases from the minimum value "0" to the maximum value "1" when the virtual engine speed increases from 0 to the maximum value MAX. In the example of FIG. 12, the second order sound gain $K_{d2}$ monotonously increases so as to be substantially proportional to the virtual engine speed, and saturates to the maximum value "1" in a region of a virtual engine speed or more smaller than the maximum engine speed MAX.

The characteristic curves to provide the first and second order sound gains $K_{d1}$, $K_{d2}$ are mere examples, and other characteristic curves can of course be used. Alternatively, one or both of the characteristic curves to provide the first and second order sound gains $K_{d1}$, $K_{d2}$ may be prepared in a plurality of types so as to allow selecting those curves according to the type of the electric two-wheeled vehicle 1 and user preference. As a result, the volume characteristics of an order sound with respect to the estimated accelerator opening degree and/or virtual engine speed can be tuned.

Figure 13:
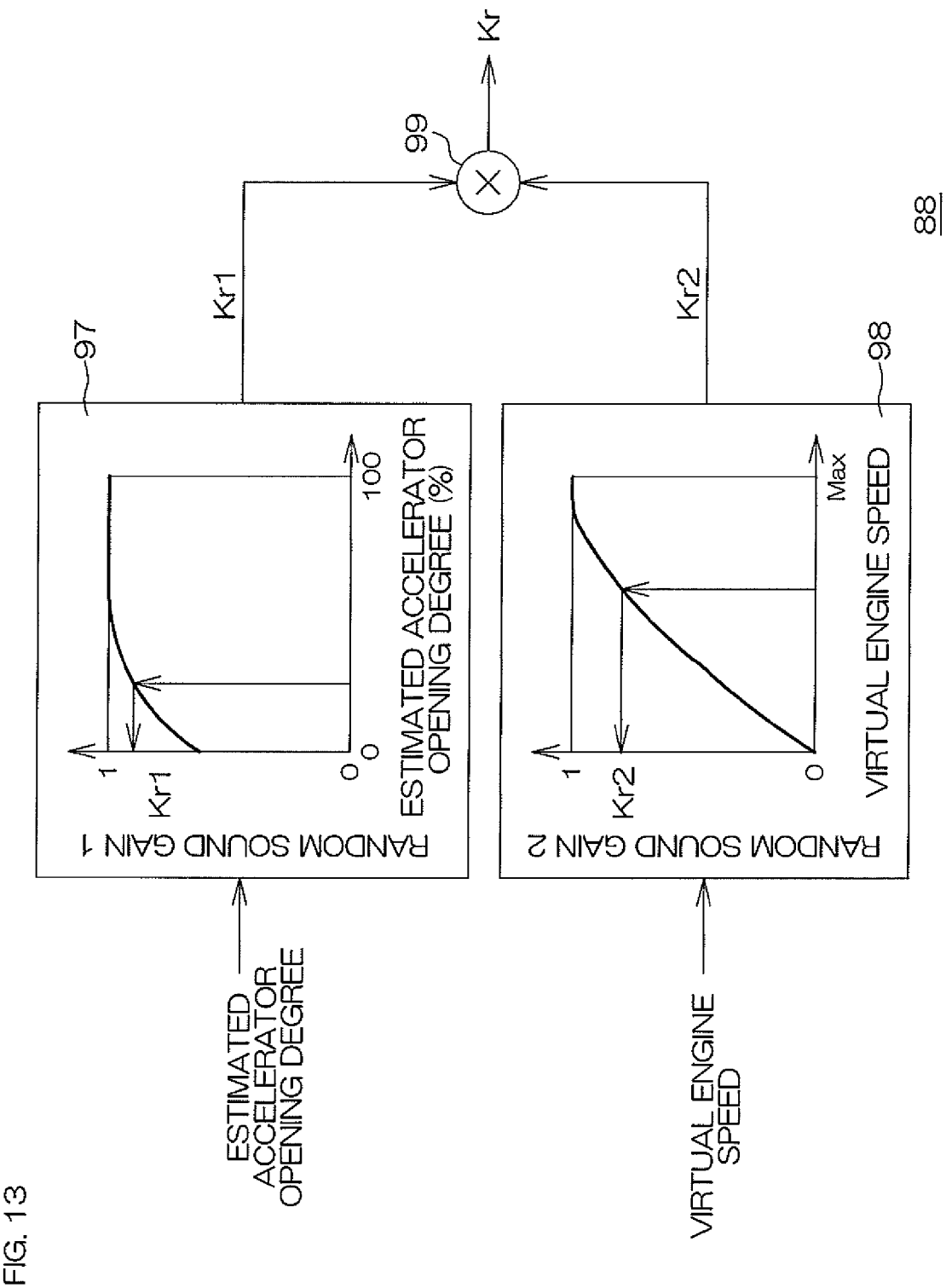
FIG. 13 is a view for explaining a configuration example of a random sound gain generation unit.

FIG. 13 is a view for explaining a configuration example of the random sound gain generation unit 88. The random sound gain generation unit 88 includes a first random sound gain setting unit 97, a second random sound gain setting unit 98, and a multiplication unit 99. The first random sound gain setting unit 97 sets a first random sound gain $K_{r1}$ according to the accelerator opening degree. The second random sound gain setting unit 98 sets a second random sound gain $K_{r2}$ according to the virtual engine speed. The multiplication unit 99 determines a random sound gain $K_r$ ($=K_{r1} \times K_{r2}$) by multiplying the first random sound gain $K_{r1}$ and the second random sound gain $K_{r2}$ by each other. The random sound gain $K_r$ is provided to the random sound gain multiplication unit 89 (refer to FIG. 10).

The first random sound gain $K_{r1}$ is set, for example, in accordance with a characteristic curve (map data) that monotonously increases from the minimum value larger than 0 to the maximum value "1" when the estimated accelerator opening degree increases from 0% to 100%. In the example of FIG. 13, the first random sound gain $K_{r1}$ is set so as to nonlinearly and monotonously increase with an increase in the estimated accelerator opening degree, and its rate of increase is smaller as the estimated accelerator opening degree is larger.

The second random sound gain $K_{r2}$ is set, for example, in accordance with a characteristic curve (map data) that monotonously increases from the minimum value "0" to the maximum value "1" when the virtual engine speed increases from 0 to the maximum value MAX. In the example of FIG. 13, the second random sound gain $K_{r2}$ nonlinearly and monotonously increases with an increase in the virtual engine speed, and its rate of increase is smaller as the virtual engine speed is larger. In addition, the second random sound gain $K_{r2}$ saturates to the maximum value "1" in a region of a virtual engine speed or more smaller than the maximum engine speed MAX.

The characteristic curves to provide the first and second random sound gains $K_{r1}$, $K_{r2}$ are mere examples, and other characteristic curves can of course be used. Alternatively, one or both of the characteristic curves to provide the first and second random sound gains $K_{r1}$, $K_{r2}$ may be prepared in a plurality of types so as to allow selecting those curves according to the type of the electric two-wheeled vehicle 1 and user preference. As a result, the volume characteristics of a random sound with respect to the estimated accelerator opening degree and/or virtual engine speed can be tuned.

Figure 14A:
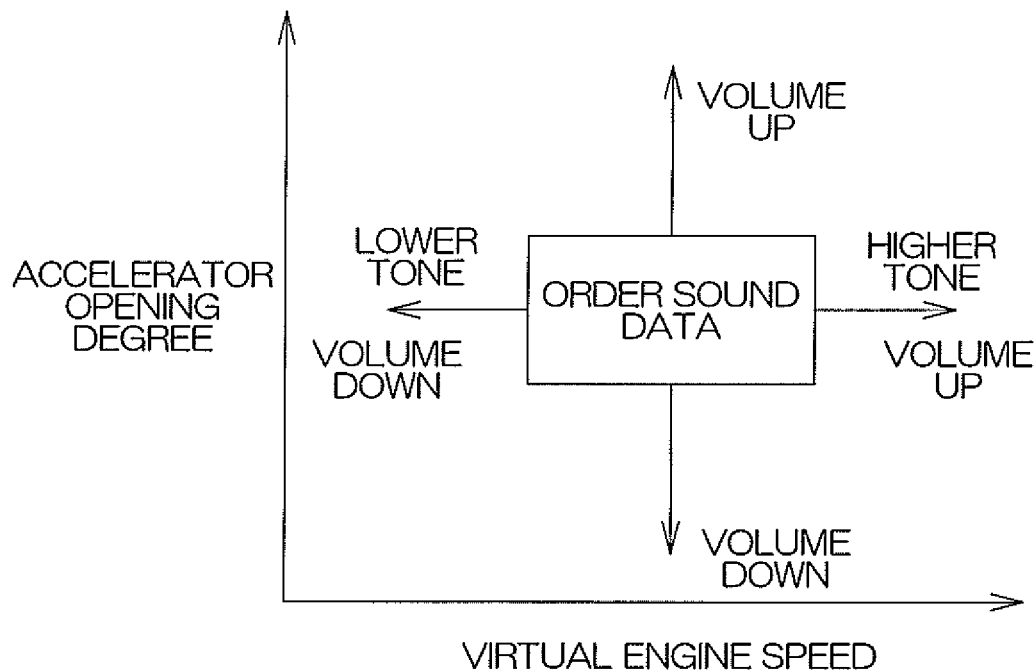
FIG. 14A is a view for explaining changes in order sound data according to the accelerator opening degree and virtual engine speed.

FIG. 14A is a view for explaining changes in order sound data according to the accelerator opening degree and virtual engine speed. The volume of the order sound data is changed to be higher as the virtual engine speed is larger and to be higher as the accelerator opening degree is larger. Moreover, the tone of the order sound data is changed to be higher as the virtual engine speed is larger, and does not depend on the accelerator opening degree.

Figure 14B:
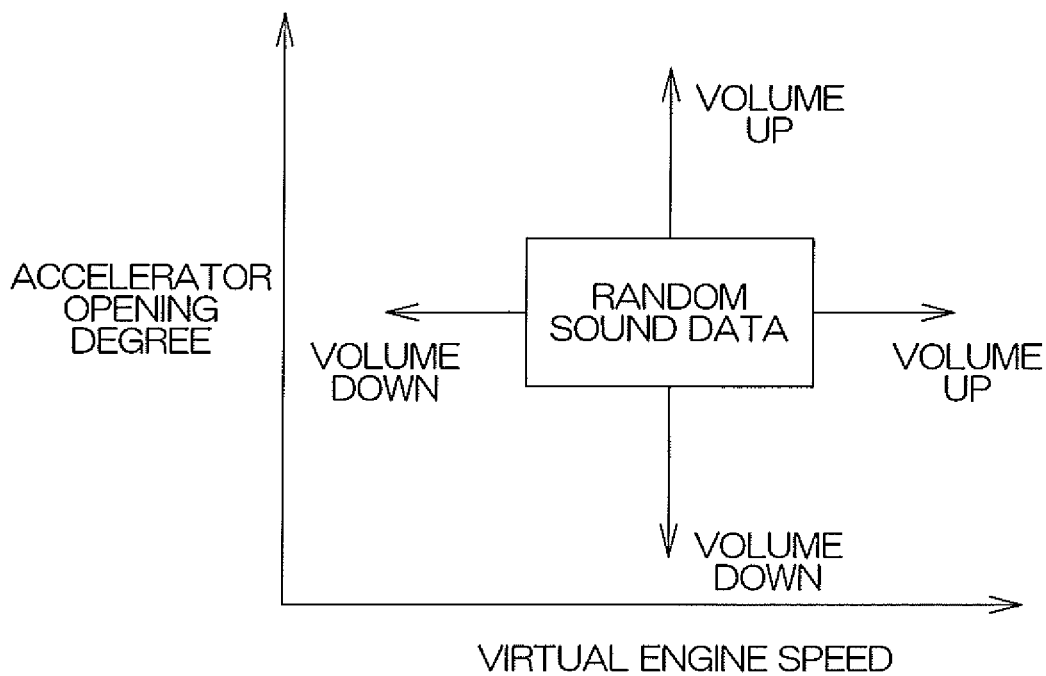
FIG. 14B is a view for explaining changes in random sound data according to the accelerator opening degree and virtual engine speed.

FIG. 14B is a view for explaining changes in random sound data according to the accelerator opening degree and virtual engine speed. The volume of the random sound data is changed to be higher as the virtual engine speed is larger and to be higher as the accelerator opening degree is larger. Moreover, the tone of the random sound data does not depend on the virtual engine speed or the accelerator opening degree.

Figure 15:
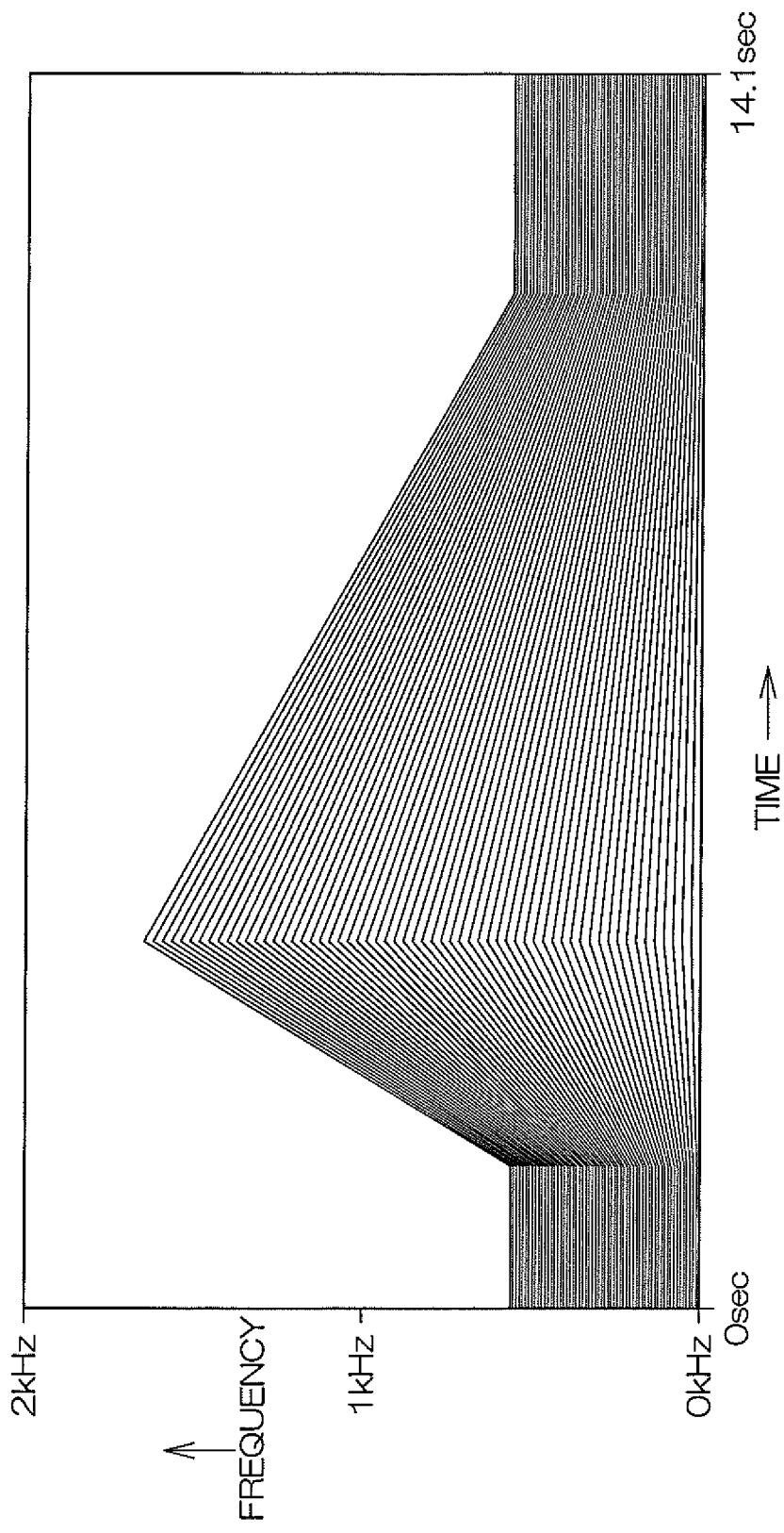
FIG. 15 shows an example where order sound data was reproduced and frequency-analyzed.

FIG. 15 shows an example where order sound data was reproduced and frequency-analyzed. The horizontal axis shows time, and the vertical axis shows frequency. Shown are reproduction results of order sound data when the accelerator opening degree was increased quickly from 0% to 100% at a timing to start acceleration and then kept at 100%, and then was quickly reduced to 0% after the engine speed rose to a predetermined value. The virtual engine speed has increased and decreased according to an increase and decrease in the accelerator opening degree, and the order sound frequency increases and decreases accordingly. The intensity of frequency components in a harmonic (overtone) relationship appears strongly.

When the same reproduction is performed for random sound data, there is a distribution of wide-band noise components having such frequency characteristics that low-frequency components are large and the sound pressure is reduced toward higher frequencies in a coordinate plane with rectangular coordinates of time and frequency, and the sound pressure as a whole increases and decreases with a rise/fall in engine speed. That is, the spectral shape does not depend on time, and it is understood that a random sound does not depend on the virtual engine speed.

As in the above, according to the present preferred embodiment, a vehicle speed is estimated based on output signals of the acceleration sensor 41 and the angular rate sensor 42 provided in the running-linked sound producing device 30 (built in, for example, a case of the device main body 31). Therefore, because it is not necessary to obtain vehicle speed information from the vehicle body of the electric two-wheeled vehicle 1, a wiring therefore is not required. Moreover, because an accelerator command value (accelerator opening degree) is also estimated based on the estimated vehicle speed, a wiring for obtaining the operation amount of the accelerator grip from the vehicle body of the electric two-wheeled vehicle 1 is also not required. Therefore, because wirings can be reduced, the configuration of the running-linked sound producing device 30 can be simplified, and fitting to the electric two-wheeled vehicle 1 also becomes easy. Nevertheless, a running-linked sound according to the estimated vehicle speed and accelerator command value is generated, so that an appropriate running-linked sound according to the running state of the electric two-wheeled vehicle 1 can be produced.

The prior art of Japanese Unexamined Patent Application Publication No. 2000-1142 may be suitable for four-wheeled vehicles, but there are still many challenges to be solved in applying the prior art to vehicles of more simple structures represented by two-wheeled vehicles including the electric two-wheeled vehicle 1. For example, in a four-wheeled vehicle, output signals of sensors are easily obtained because an in-vehicle LAN is equipped. On the other hand, in a vehicle without an in-vehicle LAN and with a simple arrangement of electrical components, such as a two-wheeled vehicle, it is not easy to obtain sensor signals. Even when sensor signals can be obtained by adding wirings, a large number of wirings are required, so that not only is the structure complicated, but the number of fitting steps is also increased, and it is inevitable that the cost is increased accordingly. For two-wheeled vehicles and the like that are lower priced than four-wheeled vehicles, low-cost equipment is demanded accordingly, so that widespread use of a costly device is difficult.

The present preferred embodiment solves such technical challenges, and provides a running-linked sound producing device which has a simple configuration and is also easily fitted to a vehicle. The running-linked sound producing device of the present preferred embodiment does not require a large number of wiring connections when being fitted after completion of a vehicle body, let alone when being mounted during assembly of a vehicle body, and can therefore be easily mounted on the vehicle body. Of course, wiring connections for input of sensor signals are also not necessary when the device is replaced, making the work easy.

Further, in the present preferred embodiment, because the torque estimation unit 60 that estimates the producing torque (necessary torque $T_2$) of the electric motor 5 according to an estimated vehicle speed is provided, it is not necessary to obtain information for estimating the producing torque from the vehicle. Then, because an accelerator opening degree as an accelerator command value is estimated according to the estimated producing torque, the accelerator opening degree can be accurately estimated. That is, an output (producing torque) of the electric motor 5 is estimated from the vehicle speed, and an accelerator opening degree to produce the output is estimated.

Further, in the present preferred embodiment, the torque estimation unit 60 includes a running resistance computing unit 61 and a necessary torque computing unit 62. The accelerator opening degree estimation unit 65 estimates an accelerator opening degree based on the necessary torque $T_2$ computed by the necessary torque computing unit 62 and the motor rotation speed estimated from the vehicle speed V. As a result, the accelerator opening degree can be more accurately estimated, so that a running-linked sound matching the running state of the electric two-wheeled vehicle 1 can be produced.

Furthermore, in the present preferred embodiment, the necessary torque computing unit 62 is programmed to compute necessary torque $T_2$ based on the running resistance, the vehicle acceleration α estimated by the vehicle acceleration calculation unit 54, and the road surface gradient angle θ estimated by the road surface gradient estimation unit 50. Therefore, the necessary torque $T_2$ is computed based on not only the running resistance but also the estimated acceleration and road surface gradient. By using such necessary torque $T_2$, the accelerator opening degree can be accurately estimated, so that a running-linked sound reflecting the running state of the electric two-wheeled vehicle 1 can be produced more accurately.

Further, in the present preferred embodiment, the accelerator opening degree estimation unit 65 includes a producing torque ratio calculation unit 66 that computes a producing torque ratio ($T_2/T_1$) being a ratio of the necessary torque $T_2$ to the maximum torque $T_1$ that can be produced by the electric motor 5. An accelerator opening degree is estimated based on the producing torque ratio ($T_2/T_1$). As a result, the accelerator opening degree can be more appropriately estimated, so that a running-linked sound reflecting the running state of the electric two-wheeled vehicle 1 can be produced more accurately.

Moreover, in the present preferred embodiment, the output (acceleration $\alpha'$) of the acceleration sensor 41 is corrected according to the road surface gradient angle $\theta$ estimated by the road surface gradient estimation unit 50, and the corrected acceleration $\alpha$ is integrated to estimate a vehicle speed V. This arrangement, when the acceleration of gravity g has an influence on the output of the acceleration sensor 41 due to a road surface gradient, allows determining a vehicle acceleration $\alpha$ of the electric two-wheeled vehicle 1 reducing or eliminating the influence. As a result, estimation of a vehicle speed V based on the vehicle acceleration $\alpha$ can be accurately performed, so that a running-linked sound matching the running state of the electric two-wheeled vehicle 1 can be produced.

Moreover, in the present preferred embodiment, an angular rate detected by the angular speed sensor 42 built in the device main body 31 is integrated to estimate a gradient angle $\theta$ of a road surface on which the electric two-wheeled vehicle 1 is running. Therefore, the road surface gradient angle $\theta$ can be determined without providing a sensor for directly detecting a road surface gradient. As a result, a running state of the electric two-wheeled vehicle 1 reflecting a road surface gradient can be determined with a simple configuration, and accordingly, a running-linked sound matching the running state of the electric two-wheeled vehicle 1 can be produced.

Moreover, in the present preferred embodiment, a motor rotation speed is determined, based on the estimated vehicle speed V, by the motor rotation speed computing unit 63. Therefore, it is not necessary to obtain information concerning the motor rotation speed from the vehicle body of the electric two-wheeled vehicle 1. Therefore, the running-linked sound producing device 30 can be equipped on the electric two-wheeled vehicle 1 at a low cost, and can produce a running-linked sound that is appropriately linked to the running state of the electric two-wheeled vehicle 1.

Moreover, in the present preferred embodiment, a virtual engine speed is determined, based on the estimated vehicle speed V and estimated accelerator opening degree, by the virtual engine speed calculation unit 80. As a result, a virtual engine speed can be obtained without obtaining information concerning the engine speed from the vehicle body of the electric two-wheeled vehicle 1. However, in the present preferred embodiment, the electric two-wheeled vehicle 1 cannot generate engine speed information because it is not provided with an engine. In either case, because it is not necessary to obtain engine speed information from the vehicle body, the running-linked sound producing device 30 can be equipped on the electric two-wheeled vehicle 1 at a low cost, and can produce an internally generated running-linked sound according to the virtual engine speed.

Moreover, according to the present preferred embodiment, the order sound data generation unit 91 changes the tone of basic order sound data according to the virtual engine speed, and further changes the volume thereof according to the virtual engine speed and accelerator opening degree to generate order sound data. Moreover, the random sound data generation unit 92 does not change the tone of basic random sound data, and changes the volume thereof according to the virtual engine speed and accelerator opening degree to generate random sound data. As a result of these sound data being superimposed with each other in the synthesis unit 90, synthetic engine sound data is generated.

As a result, a natural engine sound close to an actual engine sound can be generated as a running-linked sound. That is, a deep (with a sense of depth), comfortable engine sound can be synthesized. Furthermore, because synthetic engine sound data is obtained by generating order sound data by changing the tone and volume of basic order sound data, generating random sound data by changing the volume of basic random sound data, and combining these sound data, the configuration is simple. Therefore, a comfortable natural engine sound can be generated as a running-linked sound with the simple configuration.

An engine sound produced by an engine as an example of a motor includes an order sound component whose frequency changes proportional to the engine speed and a random sound component whose frequency does not change depending on the engine speed. For example, the frequency of an order sound is proportional to the explosion frequency of an engine. For example, when a 2-stroke 1-cylinder engine is operated at an engine speed of 6000 rpm (100 revolutions per second), a sound of a fundamental wave of 100 Hz and its harmonics is produced. If the engine speed is half, 3000 rpm, a sound of a fundamental wave of 50 Hz and its harmonics is produced. These are order sound components. The higher the engine speed and the larger the engine load (accelerator opening degree), the larger the volume of an order sound component. The frequency of a random sound component has nothing to do with the engine speed, and the higher the engine speed and the larger the engine load (accelerator opening degree), the larger the volume thereof.

The same applies to a motor sound produced by an electric motor being another example of a motor. That is, a motor sound includes an order sound component whose frequency fluctuates depending on the motor rotation speed and a random sound component whose frequency tendency does not change even when the motor rotation speed changes. For both the order sound component and random sound component, the volume is higher as the motor rotation speed is larger and larger as the motor load (motor current) is larger.

In the conventional technology of simulated sound synthesis for synthesizing a simulated sound of a motor, as described also in Japanese Unexamined Patent Application Publication No. 2000-1142, an actual motor sound is recorded to prepare basic sound data, and the volume and reproduction time of the basic sound data is changed to synthesize a simulated sound. The present inventor has focused on the fact that a simulated sound thus synthesized results in an unnatural sound different from the sound produced by an actual motor, and discovered that the cause is that basic sound data contains not only an order sound component but also a random sound component. That is, when the reproduction time of basic sound data is changed, the tones of both an order sound component and a random sound component contained in the basic sound data change equally, so that a simulated sound that gives an unnatural impression is generated. Accordingly, the present inventor has prepared basic order sound data and basic random sound data separately by a computer. Then, as a result of changing the tone of the basic order sound data according to the motor rotation speed while not changing the tone of the basic random sound data and combining these data, the present inventor has discovered that a natural simulated sound to give an impression close to that of the sound produced by an actual motor is obtained. That is, the foregoing preferred embodiment is based on the discovery of a new challenge in simulated sound synthesis, and provides a solution for that challenge.

Figure 16B:
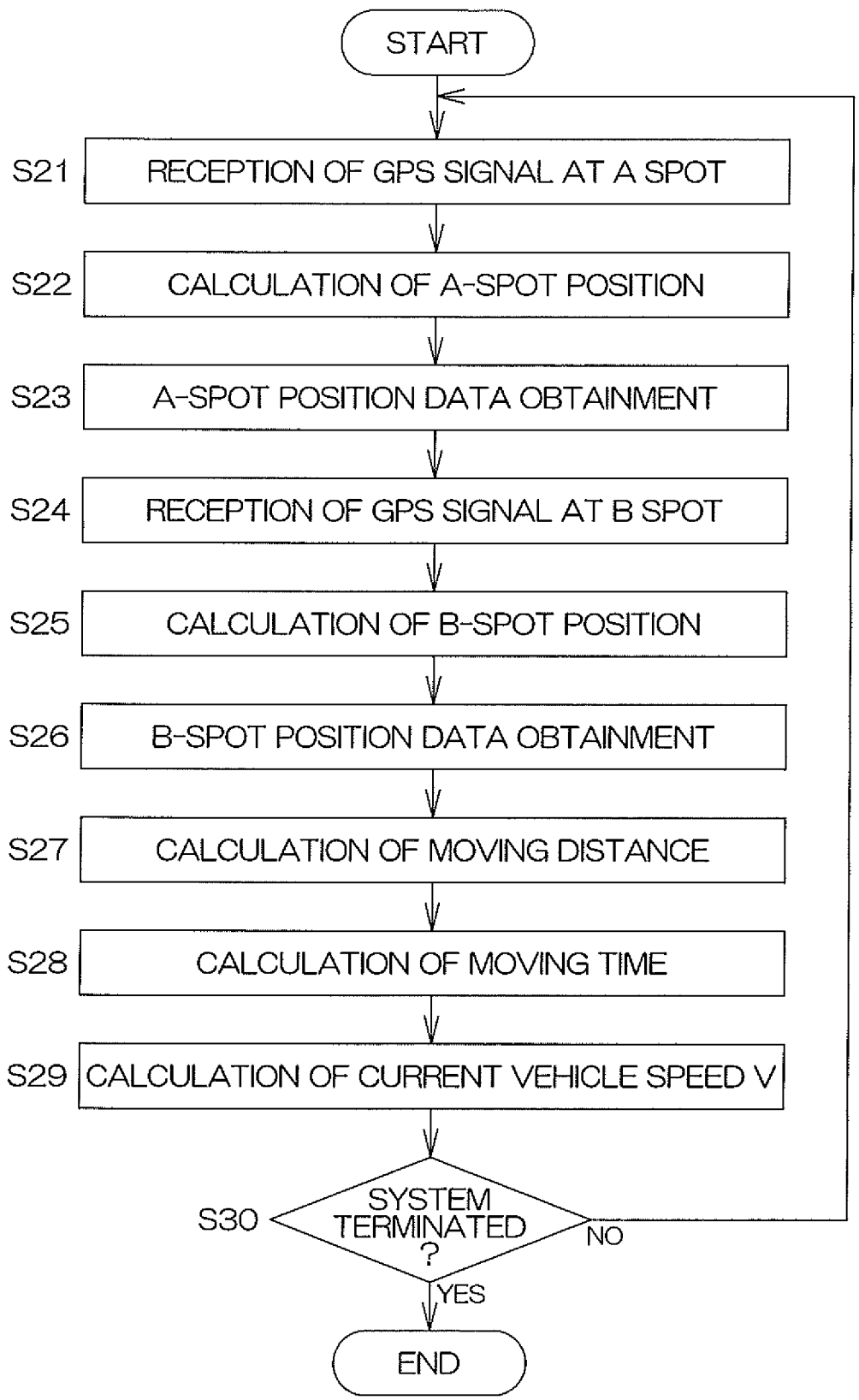
FIG. 16B is a flowchart for explaining an example of vehicle speed estimation using position data output by a GPS receiver.

FIG. 16A and FIG. 16B explain a running-linked sound producing device according to another preferred embodiment of the present invention, showing another configuration example for vehicle speed estimation. More specifically, in the present preferred embodiment, as shown by the alternate long and two short dashed line in FIG. 2, the running-linked sound producing device 30 includes a GPS receiver 45, which is provided in the case of the device main body 31. The vehicle speed estimation unit 37 is programmed to estimate a vehicle speed of the electric two-wheeled vehicle 1 using an output signal of the GPS receiver 45. The GPS receiver 45 receives radio waves from three GPS satellites 46-1, 46-2, 46-3 out of a plurality of GPS satellites orbiting the earth to carry out positioning, and outputs position data representing its current position.

The GPS receiver 45 receives signals from the GPS satellites 46-1, 46-2, 46-3 at a first spot A (step S21), and generates first position data representing the position of the first spot A based on the received signals (step S22). The first position data includes position information of the first spot A and information on time (positioning time) for which the GPS receiver 45 has received radio waves at the first spot A. The vehicle speed estimation unit 37 obtains the first position data (step S23).

Further, after an elapse of a certain time, the GPS receiver 45 receives signals from the GPS satellites 46-1, 46-2, 46-3 at a second spot B (step S24), and generates second position data representing the position of the second spot B based on the received signals (step S25). The second position data includes position information of the second spot B and information on time (positioning time) for which the GPS receiver 45 has received radio waves at the second spot B. The vehicle speed estimation unit 37 obtains the second position data (step S26).

The vehicle speed estimation unit 37, based on the first position data and second position data, calculates a distance (moving distance) between the first spot A and the second spot B (step S27), and further calculates time (moving time) required for a movement between those spots (step S28). The vehicle speed estimation unit 37 calculates a vehicle speed V (=moving distance/moving time) by dividing the moving distance by the moving time (step S29). This operation is repeated until system termination, that is, power-off of the running-linked sound producing device 30 (step S30).

Also with such a configuration, the running-linked sound producing device 30 can estimate a vehicle speed of the electric two-wheeled vehicle 1 without obtaining a signal for vehicle speed estimation from the vehicle body of the electric two-wheeled vehicle 1. As a result, a running-linked sound producing device 30 which has a simple configuration, is easily fitted to the electric two-wheeled vehicle 1, and can produce a running-linked sound corresponding to the running state of the electric two-wheeled vehicle 1 can be provided.

Figure 17:
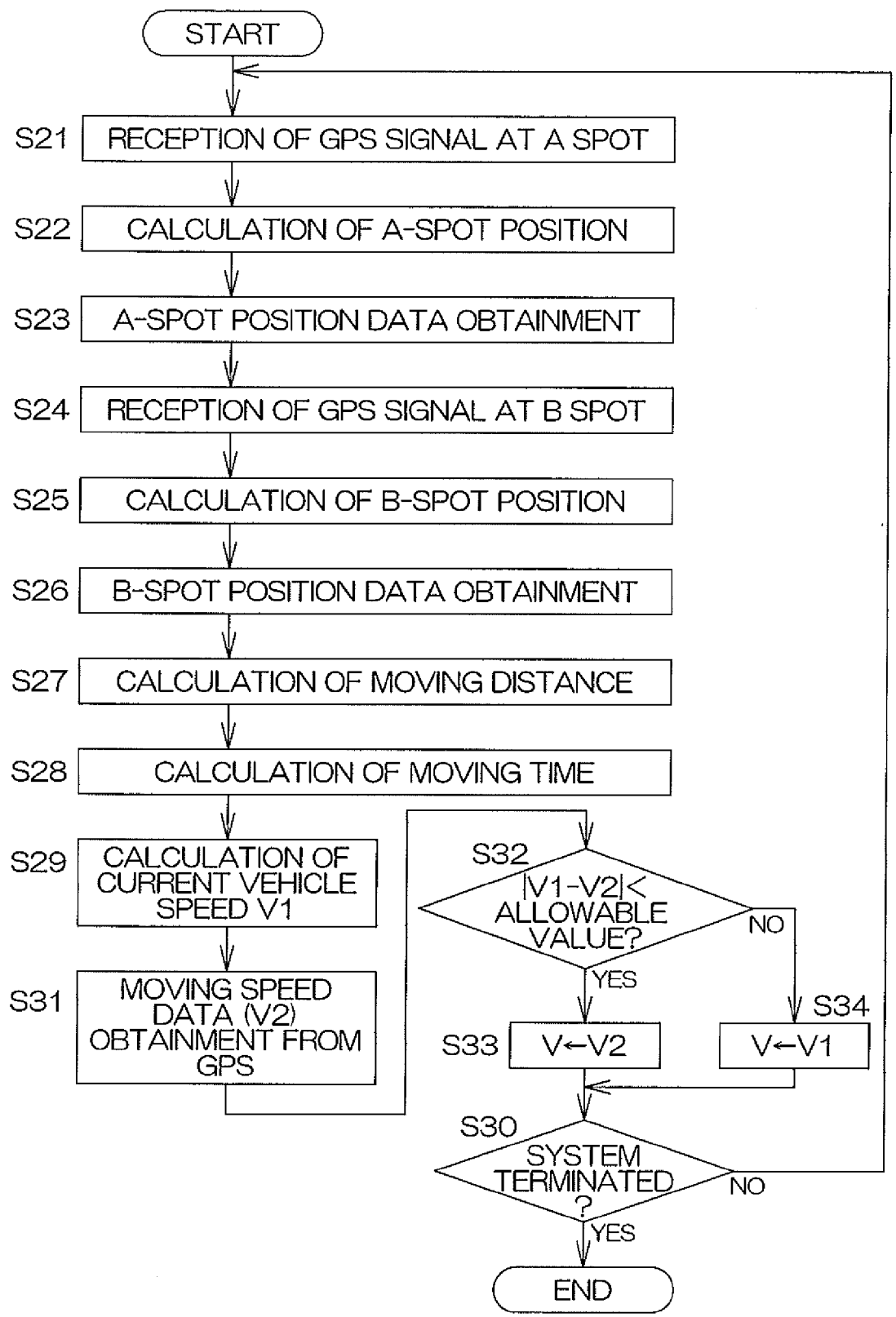
FIG. 17 is a flowchart for explaining a running-linked sound producing device according to still another preferred embodiment of the present invention, showing an example of vehicle speed estimation using moving speed data output by a GPS receiver.

FIG. 17 explains a running-linked sound producing device according to still another preferred embodiment of the present invention, showing another configuration example for vehicle speed estimation. Similarly to the preferred embodiment described with reference to FIG. 16A and FIG. 16B, the present preferred embodiment also uses an output of the GPS receiver 45. However, in the present preferred embodiment, the GPS receiver 45 outputs not only position data but also moving speed data. More specifically, the GPS receiver 45 has a speed calculating function to calculate a moving speed of the GPS receiver 45 by using the Doppler effect of carrier waves from the GPS satellites 46-1, 46-2, 46-3 (refer to FIG. 16A).

More specifically, a first vehicle speed V1 is estimated, using position data generated by the GPS receiver 45, through the same steps S21 to S29 as with the case of FIG. 16B. Further, the vehicle speed estimation unit 37 obtains as a second vehicle speed V2 moving speed data generated by the GPS receiver 45 at the second spot B (step S31). Further, the vehicle speed estimation unit 37 judges whether a difference |V1−V2| between the first vehicle speed V1 and the second vehicle speed V2 is less than a predetermined allowable value (constant value) (step S32). If the difference is less than the allowable value (or not more than the allowable value), the second vehicle speed V2 is set as a current vehicle speed V (step S33). If the difference is not less than the allowable value (or exceeds the allowable value), the first vehicle speed V1 is set as a current vehicle speed V (step S34). This operation is repeated until system termination, that is, power-off of the running-linked sound producing device 30 (step S30).

The first vehicle speed V1 is calculated at a point in time where the vehicle has moved from the first spot A to the second spot B, and is thus accurate, but it takes time until a vehicle speed can be estimated. That is, updating takes time. The second vehicle speed V2 can be promptly obtained from the GPS receiver 45, but sometimes contains a large error depending on the reception status of radio waves from the GPS satellites. Therefore, in the present preferred embodiment, when the difference between the first and second vehicle speeds V1, V2 is less than the allowable value, the second vehicle speed V2 is used as the vehicle value V considering that the value of the second vehicle speed V2 measured by using the Doppler effect is reliable. When the difference between the first and second vehicle speeds V1, V2 is not less than the allowable value, the second vehicle speed V2 is considered to be unreliable, and the first vehicle speed V1 is used.

Thus, also with the present preferred embodiment, a vehicle speed can be estimated without obtaining information from the vehicle body of the electric two-wheeled vehicle 1. Therefore, a running-linked sound producing device 30 which has a simple configuration and is easily fitted to the electric two-wheeled vehicle 1, but can produce a running-linked sound corresponding to the running state can be provided.

Although, in the preferred embodiment of FIG. 17, position data and speed data generated by the GPS receiver 45 are preferably used, a second GPS receiver for generating speed data may be provided besides a first GPS receiver for generating position data. In this case, it suffices to obtain position data from the first GPS receiver and obtain speed data from the second GPS receiver. The speed data generated by the GPS receiver is used not for running control of the electric two-wheeled vehicle 1, but is merely used for generation of a running-linked sound. Therefore, it does not matter even when the speed data contains some errors. Therefore, a vehicle speed of the electric two-wheeled vehicle 1 may be estimated exclusively using the speed data generated by the GPS receiver.

Although the preferred embodiments of the present invention have been described as above, the present invention can also be carried out by still other preferred embodiments. For example, in the foregoing preferred embodiments, the electric two-wheeled vehicle 1 has been mentioned as an example of a vehicle, but a preferred embodiment of the present invention can be applied also to a vehicle having an engine (internal combustion engine) as its power source. Of course, a preferred embodiment of the present invention may be applied to a hybrid type vehicle having as its power sources both an electric motor and engine. Of course, a preferred embodiment of the present invention can be applied also to a vehicle other than a two-wheeled vehicle.

Moreover, in the foregoing preferred embodiments, description has been given of a running-linked sound producing device that generates an engine sound (simulated engine sound) as a running-linked sound, but the running-linked sound may be other than an engine sound. For example, a running-linked sound (simulated motor sound) simulating an operation sound of an electric motor may be generated, and a different type of sound from a sound generated by a motor may be generated. Further, the running-linked sound to be generated is not necessarily of one type, and the running-linked sound producing device may be configured so as to be able to generate a plurality of types of running-linked sounds selectively.

Moreover, in the foregoing preferred embodiments, basic order sound data and basic random sound data simulating an order sound component and a random sound component of an engine (or a vehicle powered by an engine), respectively, are preferably used as first and second component basic sound data. For generating a running-linked sound other than an engine sound or motor sound, it suffices to prepare first component basic sound data and second component basic sound data accordingly. It then suffices to change the tone of the first component basic sound data according to a motor rotation speed and keep the tone of the second component basic sound data regardless of the motor rotation speed.

Further, in the foregoing preferred embodiments, the running-linked sound producing device 30 having a configuration of the device main body 31 and the speaker 32 being connected by the wiring 33 has been disclosed, but the device main body 31 and the speaker 32 may be unitary. In this way, wiring between the device main body 31 and the speaker 32 can also be omitted, so that the configuration is further simplified, and fitting work to a vehicle body also becomes easier.

Further, in the foregoing preferred embodiments, a configuration of estimating a vehicle speed and the like using the sensors 40 included in the running-linked sound producing device 30 has been disclosed, but the present invention is not limited to this configuration. That is, a running-linked sound producing device of a preferred embodiment of the present invention may also be arranged to obtain information concerning the running state of the electric two-wheeled vehicle 1, such as the vehicle speed, motor rotation speed, and accelerator operation amount, from the vehicle body of the electric two-wheeled vehicle 1.

Moreover, a "vehicle" to which a running-linked sound producing device of the present invention is to be applied may be an actual vehicle or may be a virtual vehicle. For example, a running-linked sound producing device of a preferred embodiment of the present invention may also be arranged to produce a running-linked sound according to the running state of a virtual vehicle on a computer.

In addition, the preferred embodiments of the present invention can be variously modified in design within the scope of the matters described in the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A running-linked sound producing device for producing a running-linked sound according to a running state of a vehicle, the running-linked sound producing device comprising:
   a first component sound data generation unit programmed to generate first component sound data by changing a tone of first component basic sound data according to a motor rotation speed of the vehicle;
   a second component sound data generation unit programmed to generate second component sound data by changing a volume of second component basic sound data according to the motor rotation speed and an accelerator command value of the vehicle, without changing a tone of the second component basic sound data; and
   a synthetic sound data generation unit programmed to generate synthetic sound data by combining the first component sound data generated by the first component sound data generation unit and the second component sound data generated by the second component sound data generation unit.

2. The running-linked sound producing device according to claim 1, wherein the first component basic sound data includes basic data corresponding to an order sound whose frequency fluctuates according to the motor rotation speed; and
   the second component basic sound data includes basic data corresponding to a random sound whose frequency does not fluctuate regardless of the motor rotation speed.

3. The running-linked sound producing device according to claim 1, wherein the first component sound data generation unit includes a tone changing unit programmed to change a tone of the first component basic sound data according to the motor rotation speed of the vehicle, and a first component volume changing unit programmed to change a volume of the first component basic sound data according to the motor rotation speed and the accelerator command value of the vehicle.

* * * * *